(12) United States Patent
Park

(10) Patent No.: US 8,679,965 B2
(45) Date of Patent: Mar. 25, 2014

(54) SEMICONDUCTOR DEVICE HAVING A REDUCED BIT LINE PARASITIC CAPACITANCE AND METHOD FOR MANUFACTURING THE SAME

(71) Applicant: SK Hynix Inc., Gyeonggi-do (KR)

(72) Inventor: Jeong Hoon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/661,851

(22) Filed: Oct. 26, 2012

(65) Prior Publication Data

US 2013/0052788 A1 Feb. 28, 2013

Related U.S. Application Data

(62) Division of application No. 12/493,275, filed on Jun. 29, 2009, now Pat. No. 8,330,197.

(30) Foreign Application Priority Data

May 11, 2009 (KR) .................. 10-2009-0040737

(51) Int. Cl.
*H01L 21/4763* (2006.01)
(52) U.S. Cl.
USPC .................................. 438/622; 257/E21.649
(58) Field of Classification Search
USPC .................. 438/381, 622, 238; 257/E21.657, 257/E21.658, E21.646, E21.649, E27.084, 257/E27.089, E27.094, E27.091, E21.659, 257/E21.66, E21.645
See application file for complete search history.

(56) References Cited

U.S. PATENT DOCUMENTS

| | | | |
|---|---|---|---|
| 6,214,663 B1 | 4/2001 | Cho et al. |
| 6,429,476 B2 | 8/2002 | Suzuki et al. |
| 6,861,688 B2 | 3/2005 | Manger et al. |
| 6,902,998 B2 | 6/2005 | Lee et al. |
| 7,511,328 B2 | 3/2009 | Seo et al. |
| 7,582,925 B2 | 9/2009 | Jung et al. |

(Continued)

FOREIGN PATENT DOCUMENTS

| | | |
|---|---|---|
| JP | 2010-242147 A | 10/2010 |
| KR | 1020000066807 A | 11/2000 |
| KR | 1020080092557 A | 10/2008 |
| KR | 1020080096285 A | 10/2008 |

OTHER PUBLICATIONS

USPTO RR mailed Oct. 11, 2011 in connection with U.S. Appl. No. 12/493,275.

(Continued)

*Primary Examiner* — Daniel Luke
*Assistant Examiner* — Latanya N Crawford
(74) *Attorney, Agent, or Firm* — Ladas & Parry LLP

(57) ABSTRACT

A semiconductor device having a reduced bit line parasitic capacitance and a method of making same is presented. The semiconductor device includes a first, second, third, and fourth interlayer dielectric layers, first and second bit lines, first and second landing plug and first and second storage node contacts. An optional capacitor may be added to complete a CMOS configuration for the semiconductor device. The storage node contacts traverse through the interlayer dielectric layer and are electrically coupled to their respective landing plug contacts. The storage node contacts are deliberately offset, relative to the center of the corresponding landing plug contacts, at a predetermined distance in a direction away from the first bit line. This offsetting aids reducing the parasitic capacitance between the bit line and a storage node.

33 Claims, 32 Drawing Sheets

(56) References Cited

U.S. PATENT DOCUMENTS

| | | | |
|---|---|---|---|
| 8,492,815 B2 * | 7/2013 | Katsuki | 257/300 |
| 2001/0046737 A1 | 11/2001 | Ahn et al. | |
| 2002/0030209 A1 * | 3/2002 | Sugiyama et al. | 257/296 |
| 2002/0096701 A1 | 7/2002 | Torii et al. | |
| 2002/0140019 A1 * | 10/2002 | Nakahata et al. | 257/306 |
| 2002/0195641 A1 | 12/2002 | Fukuda et al. | |
| 2003/0178658 A1 | 9/2003 | Shinkawata | |
| 2005/0070094 A1 * | 3/2005 | Yang et al. | 438/640 |
| 2005/0142756 A1 | 6/2005 | Park et al. | |
| 2006/0138513 A1 * | 6/2006 | Hong et al. | 257/300 |
| 2006/0138561 A1 * | 6/2006 | Seo et al. | 257/382 |
| 2010/0171160 A1 | 7/2010 | Katsuki | |

OTHER PUBLICATIONS

USPTO NFOA mailed Dec. 20, 2011 in connection with U.S. Appl. No. 12/493,275.

USPTO NOA mailed Jul. 26, 2012 in connection with U.S. Appl. No. 12/493,275.

* cited by examiner

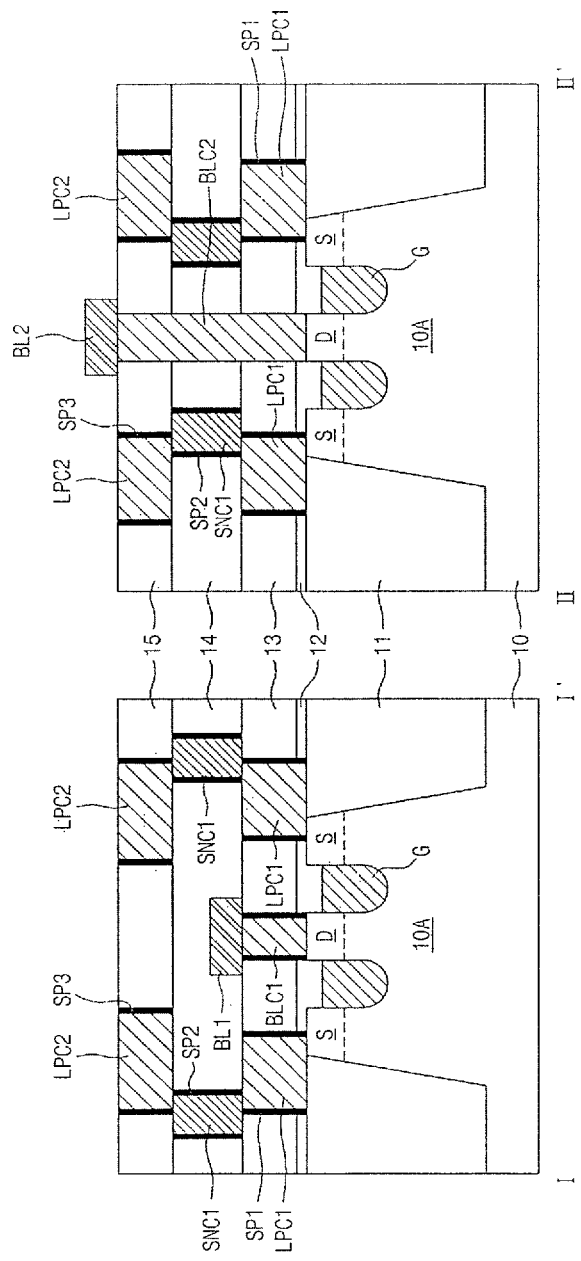

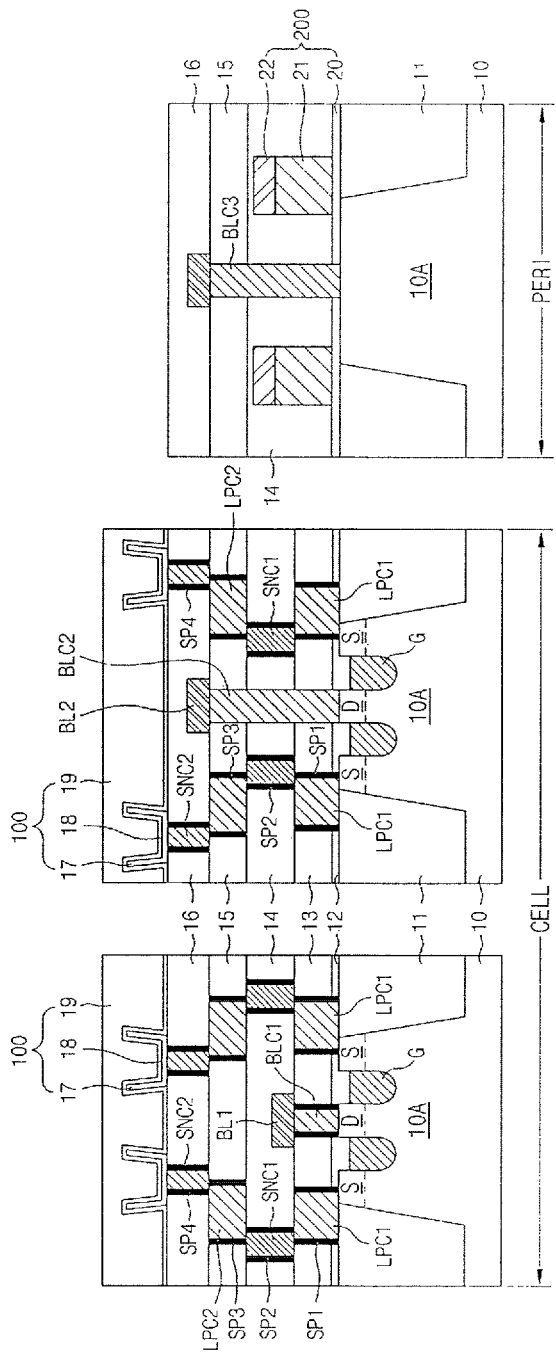

SEMICONDUCTOR DEVICE HAVING A REDUCED BIT LINE PARASITIC CAPACITANCE AND METHOD FOR MANUFACTURING THE SAME

CROSS-REFERENCE TO RELATED APPLICATIONS

The present application claims priority to Korean patent application number 10-2009-0040737 filed on May 11, 2009, which is incorporated herein by reference in its entirety.

BACKGROUND OF THE INVENTION

The present invention relates to a semiconductor device and a method for manufacturing the same, and more particularly, to a semiconductor device which is capable of decreasing the capacitance between bit lines and storage nodes and a method for manufacturing the same.

In high integration applications of DRAM (dynamic random access memory) devices which have unit cells composed of a MOS (metal oxide semiconductor) transistor and a capacitor, it is an important to increase the capacitance as well as to decrease the area of capacitors. The capacitance of capacitors is proportional to the area of the capacitor and as a result capacitors often times end up occupying a disproportionate amount of area in a chip.

In order to form a capacitor having high capacitance within a narrow area, attempts to increase the height of the capacitor and to decrease the thickness of a dielectric layer have been made.

However, if the height of a capacitor is increased, a problem can arise in that the size of a step between a cell region and a peripheral region increases. If the thickness of a dielectric layer is decreased, a problem can arise in that leakage current increases as the thickness of the dielectric layer decreases.

In order to address these problems, recently, a method has been proposed, in which a buried type gate is used to decrease bit line parasitic capacitance by about a half so that the capacitance of a capacitor required for maintaining the sense amplifier drivability to the same level can be substantially decreased.

Nevertheless, as the continued march to decreasing in the area of a cell continuously proceeds, it is necessary to take steps that further decrease bit line parasitic capacitance.

The bit line parasitic capacitance is thought to be contributed from 1) the capacitance between a bit line and a word line, 2) the capacitance between the bit line and a storage node, 3) the capacitance between bit lines and 4) the capacitance between the bit line and a substrate.

Among these components, components 3) and 4) contribute an insignificant portion below 5% in the entire bit line parasitic capacitance. Each of components 1) and 2) contributes by about half of the bit line parasitic capacitance.

The buried type gate can decrease component 1) to about one tenth so that the entire bit line parasitic capacitance can be decreased to about half.

Under this situation, a remaining technical subject is to decrease the capacitance between the bit line and the storage node. If this is done, considering the fact that components 3) and 4) are insignificant, it is likely that the entire bit line parasitic capacitance can be significantly decreased.

In order to decrease the capacitance between the bit line and the storage node, the distance between the bit line and a storage node contact should be increased as much as possible.

Nonetheless, since the storage node contact cannot but be formed by using a self-aligned contact type with respect to the bit line due to the highly resolved compact pattern, the distance between the bit line and the storage node contact cannot but be is controlled by the width of a bit line spacer.

Therefore, in order to decrease the capacitance between the bit line and the storage node, the thickness of the bit line spacer should be increased. However, if the thickness of the bit line spacer is increased, undesirable side effects arise in that the contact area between the storage node contact and the substrate decreases and the drivability of a semiconductor device deteriorates. Thus, it is difficult to actually adopt the way of increasing the thickness of the bit line spacer.

Also, when forming the storage node contact in the self-aligned contact type by etching, the bit line spacer comprises a nitride layer so as to secure etching selectivity with respect to an interlayer dielectric comprising an oxide-based layer. In this regard, because the nitride layer has high dielectric constant compared to the oxide layer, the capacitance between the bit line and the storage node can increase.

BRIEF SUMMARY OF THE INVENTION

Embodiments of the present invention are directed to a to semiconductor device which can decrease the capacitance between bit lines and storage nodes, and a method for manufacturing the same.

In one embodiment of the present invention, a semiconductor device comprises a first interlayer dielectric formed is on a substrate; first bit lines extending in a first direction on the first interlayer dielectric; a second interlayer dielectric covering the first bit lines; a third interlayer dielectric formed on the second interlayer dielectric; second bit lines extending in the first direction on the third interlayer dielectric and placed between the first bit lines; a fourth interlayer dielectric covering the second bit lines; first landing plug contacts connected to the substrate through the first interlayer dielectric; first storage node contacts connected, through the second interlayer dielectric, with portions of the first landing plug contacts in a state in which the first storage node contacts are offset by a predetermined width from the other side surfaces facing away from one side surfaces of the first landing plug contacts adjoining the first bit lines; second landing plug contacts coupled to the first storage node contacts through the third interlayer dielectric; and second storage node contacts connected, through the fourth interlayer dielectric, with portions of the second landing plug contacts in a state in which the second storage node contacts are offset by a preselected width from the other side surfaces facing away from one side surfaces of the second landing to plug contacts adjoining the second bit lines.

The semiconductor device further comprises first bit line contacts connecting the substrate and the first bit lines through the first interlayer dielectric; and second bit line contacts connecting the substrate and the second bit lines through the third, second and first interlayer dielectrics.

Each of the second and fourth interlayer dielectrics comprises an oxide layer.

The semiconductor device further comprises spacers formed between the first landing plug contacts and the first interlayer dielectric.

The semiconductor device further comprises spacers formed between the first storage node contacts and the second interlayer dielectric.

The semiconductor device further comprises spacers formed between the second landing plug contacts and the third interlayer dielectric.

The semiconductor device further comprises spacers formed between the second storage node plug contacts and the fourth interlayer dielectric.

In another embodiment of the present invention, a method for manufacturing a semiconductor device comprises the steps of forming a first interlayer dielectric in a cell region on a substrate; forming first landing plug contacts to be connected to the substrate through the first interlayer dielectric; forming first bit lines on the first interlayer dielectric to extend in a first direction; forming a second interlayer dielectric to cover the first bit lines; forming first storage node contacts through the second interlayer dielectric to be coupled to portions of the first landing plug contacts in a state in which the first storage node contacts are offset by a predetermined width from the other side surfaces facing away from one side surfaces of the first landing plug contacts adjoining the first bit lines; forming a third interlayer dielectric on the second interlayer dielectric; forming second landing plug contacts through the third interlayer dielectric to be coupled to the first storage node contacts; forming second bit lines on the third interlayer dielectric to extend in the first direction and be placed between the first bit lines; forming a fourth interlayer dielectric to cover the second bit lines; and forming second storage node contacts through the fourth interlayer dielectric to be coupled to portions of the second landing plug contacts in a state in which the second storage node contacts are offset by a preselected width from the other side surfaces facing away from one side surfaces of the second landing plug contacts adjoining the second bit lines.

Each of the second and fourth interlayer dielectrics comprises an oxide layer.

After the step of forming the second storage node contacts, the method further comprises the step of forming capacitors on the second storage node contacts.

The step of forming the first landing plug contacts comprises the steps of defining contact holes by patterning the first interlayer dielectric through a photolithographic process to expose portions of the substrate; forming a conductive layer on entire surfaces including the contact holes; and removing portions of the conductive layer which are formed outside the contact holes.

The method further comprises the step of forming spacers on sidewalls of the contact holes before forming the conductive layer.

The step of forming the first storage node contacts comprises the steps of defining contact holes by patterning the second interlayer dielectric through a photolithographic process to expose portions of the first landing plug contacts including the other side surfaces thereof facing away from one side surfaces thereof adjoining the first bit lines and portions of the first interlayer dielectric adjoining the other side surfaces of the first landing plug contacts; forming a conductive layer on entire surfaces including the contact holes; and removing portions of the conductive layer which are formed outside the contact holes.

The method further comprises the step of forming spacers on sidewalls of the contact holes before forming the conductive layer.

The step of forming the second landing plug contacts comprises the steps of defining contact holes by patterning the third interlayer dielectric through a photolithographic process to expose the first storage node contacts; forming a conductive layer on entire surfaces including the contact holes; and removing portions of the conductive layer which are formed outside the contact holes.

The method further comprises the step of forming spacers on sidewalls of the contact holes before forming the conductive layer.

The step of forming the second storage node contacts comprises the steps of defining contact holes by patterning the fourth interlayer dielectric through a photolithographic process to expose portions of the second landing plug contacts including the other side surfaces thereof facing away from one side surfaces thereof adjoining the second bit lines and portions of the third interlayer dielectric adjoining the other side surfaces of the second landing plug contacts; forming a conductive layer on entire surfaces including the contact holes; and removing portions of the conductive layer which are formed outside the contact holes.

The method further comprises the step of forming spacers on sidewalls of the contact holes before forming the conductive layer.

In the step of forming the first landing plug contacts, first bit line contacts are formed through the first interlayer dielectric to be placed under the first bit lines and be connected to the substrate.

After the step of forming the second landing plug contacts, the method further comprises the step of forming second bit line contacts through the third, second and first interlayer dielectrics to be placed under the second bit lines and be connected to the substrate.

The second bit line contacts are formed simultaneously when forming bit line contacts in a peripheral region located outside the cell region.

The second bit line contacts are formed in a manner such that, when defining bit line contact holes in the peripheral region located outside the cell region, the third, second and first interlayer dielectrics in the cell region are etched together to define contact holes, and when forming the bit line contacts in the peripheral region by filling a conductive layer in the bit line contact holes, the contact holes in the cell region are simultaneously filled with the conductive layer.

When forming the second landing plug contacts, second bit line contacts are formed through the third, second and first interlayer dielectrics to be placed under the second bit lines and be connected to the substrate.

The first bit lines are formed simultaneously when forming gates in a peripheral region located outside the cell region.

The first bit lines are formed in a manner such that, when forming a gate conductive layer in the peripheral region, the gate conductive layer is formed to extend to the cell region, and when forming gates in the peripheral region by patterning the gate conductive layer, the gate conductive layer formed in the cell region is also patterned to form the first bit lines.

The second bit lines are formed simultaneously when forming bit lines in a peripheral region located outside the cell region.

The second bit lines are formed in a manner such that, when forming a bit line conductive layer in the peripheral region, the bit line conductive layer is formed to extend to the cell region, and when forming bit lines in the peripheral region by patterning the bit line conductive layer, the bit line conductive layer formed in the cell region is also patterned to form the second bit lines.

In still another embodiment of the present invention, a method for manufacturing a semiconductor device comprises the steps of forming a first interlayer dielectric in a cell region and a peripheral region on a substrate; forming first landing plug contacts to be connected to the substrate through the first interlayer dielectric in the cell region; removing the first interlayer dielectric formed in the peripheral region; forming and patterning a conductive layer in the cell region and the peripheral region, and thereby forming first bit lines on the first interlayer dielectric in the cell region to extend in a first direction and gates on the substrate in the peripheral region; forming a second interlayer dielectric in the cell region and the peripheral region; forming first storage node contacts through the second interlayer dielectric in the cell region to be coupled to portions of the first landing plug contacts in a state in which the first storage node contacts are offset by a predetermined width from the other side surfaces facing away from one side surfaces of the first landing plug contacts adjoining the first bit lines; forming a third interlayer dielectric in the cell region and the peripheral region; forming second landing plug contacts through the third interlayer dielectric in the cell region to be coupled to the first storage node contacts; forming and patterning a conductive layer in the cell region and the peripheral region, and thereby forming second bit lines on the third interlayer dielectric in the cell region to extend in the first direction and be placed between the first bit lines and third bit lines on the third interlayer dielectric in the peripheral region; forming a fourth interlayer dielectric in the cell region and the peripheral region; and forming second storage node contacts through the fourth interlayer dielectric in the cell region to be coupled to portions of the second landing plug contacts in a state in which the second storage node contacts are offset by a preselected width from the other side surfaces facing away from one side surfaces of the second landing plug contacts adjoining the second bit lines.

The step of forming the first landing plug contacts comprises the steps of defining contact holes by patterning the first interlayer dielectric through a photolithographic process to expose portions of the substrate in the cell region; forming a conductive layer on entire surfaces including the contact holes; and removing portions of the conductive layer which are formed outside the contact holes.

The method further comprises the step of forming spacers on sidewalls of the contact holes before forming the conductive layer.

The step of forming the first storage node contacts comprises the steps of defining contact holes by patterning the second interlayer dielectric through a photolithographic process to expose portions of the first landing plug contacts including the other side surfaces thereof facing away from one side surfaces thereof adjoining the first bit lines and portions of the first interlayer dielectric adjoining the other side surfaces of the first landing plug contacts; forming a conductive layer on entire surfaces including the contact holes; and removing portions of the conductive layer which are formed outside the contact holes.

The method further comprises the step of forming spacers on sidewalls of the contact holes before forming the conductive layer.

The step of forming the second landing plug contacts comprises the steps of defining contact holes by patterning the third interlayer dielectric through a photolithographic process to expose the first storage node contacts; forming a conductive layer on entire surfaces including the contact holes; and removing portions of the conductive layer which are formed outside the contact holes.

The method further comprises the step of forming spacers on sidewalls of the contact holes before forming the conductive layer.

The step of forming the second storage node contacts comprises the steps of defining contact holes by patterning the fourth interlayer dielectric through a photolithographic process to expose portions of the second landing plug contacts including the other side surfaces thereof facing away from one side surfaces thereof adjoining the second bit lines and portions of the third interlayer dielectric adjoining the other side surfaces of the second landing plug contacts; forming a conductive layer on entire surfaces including the contact holes; and removing portions of the conductive layer which are formed outside the contact holes.

The method further comprises the step of forming spacers on sidewalls of the contact holes before forming the conductive layer.

After the step of forming the second storage node contacts, the method further comprises the step of forming capacitors on the second storage node contacts.

In the step of forming the first landing plug contacts, first bit line contacts are formed through the first interlayer dielectric to be placed under the first bit lines and be connected to the substrate.

Before the step of forming the second bit lines and the third bit lines, the method further comprises the step of forming second and third bit line contacts through the third, second and first interlayer dielectrics to be respectively placed under the second and is third bit lines and be connected to the substrate in the cell region and the peripheral region.

When forming the second landing plug contacts, second and third bit line contacts are formed through the third, second and first interlayer dielectrics to be respectively placed under the second and third bit lines and be connected to the substrate in the cell region and the peripheral region.

BRIEF DESCRIPTION OF THE DRAWINGS

FIGS. 4A through 4J are sectional views explaining the method for manufacturing a semiconductor device in accordance with the second embodiment of the present invention.

FIGS. 5A through 5J are sectional views explaining a method for manufacturing a semiconductor device in accordance with a third embodiment of the present invention.

DESCRIPTION OF SPECIFIC EMBODIMENTS

In the present invention, bit lines are formed in different layers in such a way as to be alternately arranged in a staggered manner so that the distance between the bit lines in each layer is increased, and storage node contacts are formed in the different layers in such a way as to be connected by landing plug contacts so that the distance between the storage node contact and the bit line can be maximized.

Also, unlike the conventional art in which the space between the bit line and the storage node contact is filled with only a bit line spacer comprising a nitride-based layer, in the present invention, since the space between the bit line and the storage node contact is filled with a substance preferably composed of an oxide-based layer which has dielectric constant lower than that of the nitride-based layer, the dielectric constant of an insulation layer which is placed between the bit line and the storage node contact can be decreased. As a consequence, the capacitance between the bit line and a storage node can be decreased to $1/5$ to $1/10$ compared to the conventional art.

Further, since bit line parasitic capacitance is decreased due to the decrease in the capacitance between the bit line and the storage node, it is possible to decrease the capacitance value of a cell capacitor required for maintaining the drivability of a sense amplifier to the same level.

In addition, because the drivability of the sense amplifier is enhanced with the same capacitance, refresh characteristics can be improved.

Hereafter, specific embodiments of the present invention will be described in detail with reference to the accompanying drawings. It is understood herein that the drawings are not necessarily to scale and in some instances proportions may have been exaggerated in order to more clearly depict certain features of the invention.

Figure 1:
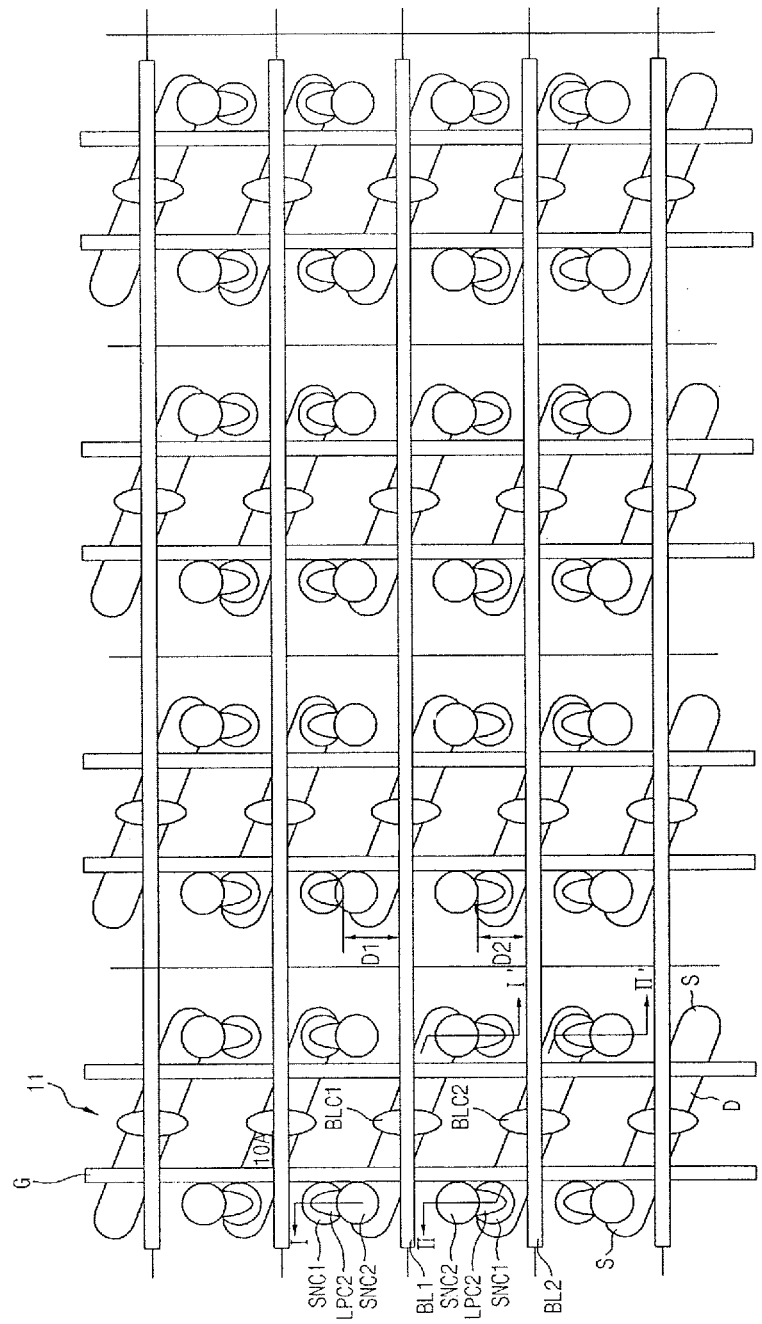
FIG. 1 is a plan view illustrating a semiconductor device in accordance with a first embodiment of the present invention.
Figure 2:
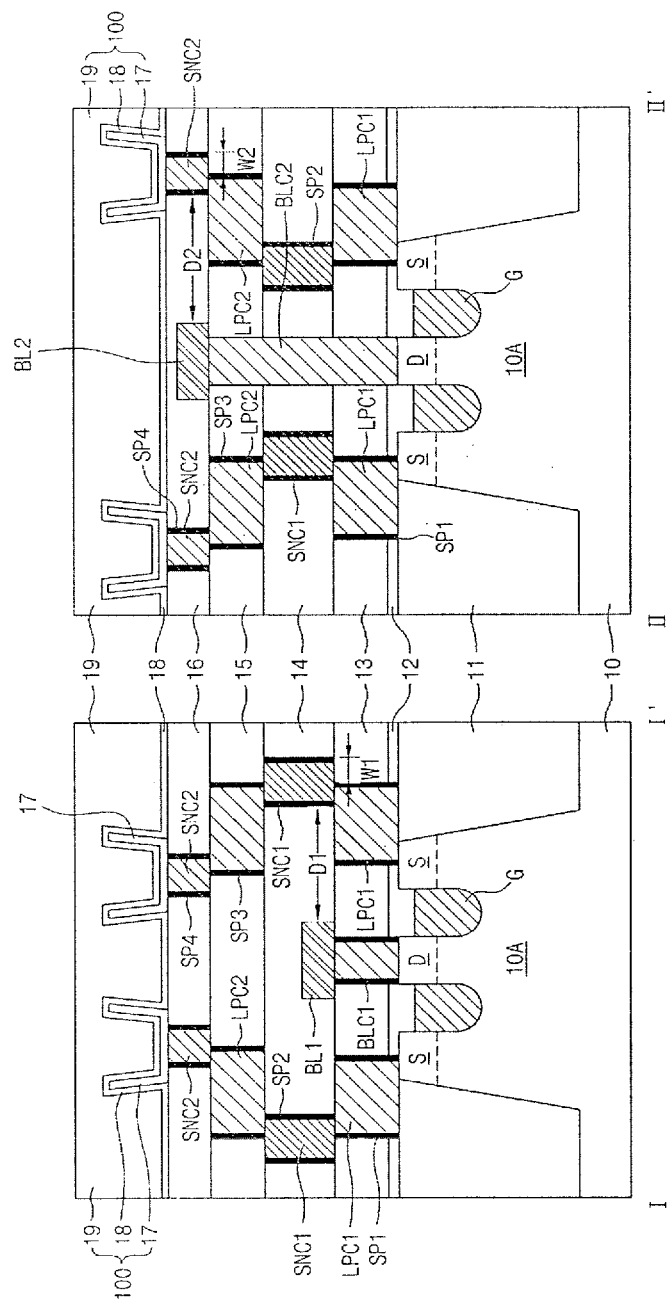
FIG. 2 is of sectional views taken along the lines I-I' and II-II' of FIG. 1.

FIG. 1 is a plan view illustrating a semiconductor device in accordance with a first embodiment of the present invention, and FIG. 2 is of sectional views taken along the lines I-I' and II-II' of FIG. 1.

Referring to FIGS. 1 and 2, a semiconductor device in accordance with a first embodiment of the present invention includes first, second, third and fourth interlayer dielectrics 13, 14, 15 and 16 which are sequentially deposited on a substrate 10, first bit lines BL1 which extend in a first direction on the first interlayer dielectric 13, second bit lines BL2 which extend in the first direction on the third interlayer dielectric 15 and are respectively placed between the first bit lines BL1, capacitors 100 which are formed on the fourth interlayer dielectric 16, and first landing plug contacts LPC1, first storage node contacts SNC1, second landing plug contacts LPC2 and second storage node contacts SNC2 which respectively pass through the first, second, third and fourth interlayer dielectrics 13, 14, 15 and 16 and connect the substrate 10 and the capacitors 100.

Each first storage node contact SNC1 is connected to a portion of the first landing plug contact LPC1 in a state in which the first storage node contact SNC1 is offset by a predetermined width W1 away from the other side surface facing away from one side surface of the first landing plug contact LPC1 adjoining the first bit line BL1 so that the distance D1 between the first storage node contact SNC1 and the first bit line BL1 can be maximized. Each second storage node contact SNC2 is coupled to a portion of the second landing plug contact LPC2 in a state in which the second storage node contact SNC2 is offset by a preselected width W2 away from the other side surface facing away from one side surface of the second landing plug contact LPC2 adjoining the second bit line BL2 so that the distance D2 between the second storage node contact SNC2 and the second bit line BL2 can be maximized.

In detail, an isolation structure 11 is formed in the substrate 10 in such a way as to delimit active regions 10A.

In order to increase the degree of integration, the active regions 10A can be aligned not to extend in the vertical or horizontal direction but are preferably aligned to be inclined along a diagonal direction at a predetermined angle.

Gate lines G are formed in the substrate 10 to extend in a second direction.

The gate lines G comprise a gate electrode layer which is formed from a gate insulation layer. The gate electrode layer can be composed of an electrically conductive material, such as a metal, for example, TiN or W.

The gate lines G preferably have a buried structure in which they are buried in the recesses defined in the substrate 10.

Sources S and drains D are formed in the active regions 10A on both sides of the gate lines G.

A liner layer (not shown) and a capping layer 12 are formed on the substrate 10 which includes the gate lines G, and the first interlayer dielectric 13 is formed on the capping layer 12. The first interlayer dielectric 13 preferably can be formed of a substance composed of an oxide-based layer.

The first landing plug contacts LPC1 are formed on the sources S to be electrically coupled to the sources S through the first interlayer dielectric 13 and the capping layer 12.

The first landing plug contacts LPC1 are formed to couple to the sources S and to the overlying first storage node contacts SNC1. The first landing plug contacts LPC1 are preferably sized to have a shape capable of maintaining sufficient ohmic contact with the sources S and the first storage node contacts SNC1 so that a minimum contact resistance can be maintained between the first landing plug contacts LPC1 and the sources S and the first storage node contacts SNC1.

Spacers SP1 can be additionally formed between the first landing plug contacts LPC1 and the first interlayer dielectric 13. The spacers SP1 can be preferably formed of a substance composed of a nitride-based layer and can have a thickness of about 10~50 Å.

The first bit lines BL1 are preferably formed on the first interlayer dielectric 13 to extend along a first direction substantially perpendicular to the gate lines G.

The first bit lines BL1 are located over the drains D which are placed in odd numbered rows. The first bit lines BL1 are electrically coupled to the drains D, placed in the odd numbered rows, via first bit line contacts BLC1 which are formed through the first interlayer dielectric 13 and the capping layer 12.

The second interlayer dielectric 14 is formed on the first interlayer dielectric 13 to cover the first bit lines BL1. The second interlayer dielectric 14 can be preferably formed of a substance composed of an oxide-based layer.

The first storage node contacts SNC1 are formed on the first landing plug contacts LPC1 in the second interlayer dielectric 14 to be electrically coupled to the first landing plug contacts LPC1.

Each first storage node contact SNC1 is coupled to a portion of the first landing plug contact LPC1 in the state in which the first storage node contact SNC1 is offset by the predetermined width W1 from the other side surface facing away from one side surface of the first landing plug contact LPC1 adjoining the first bit line BL1 so that the distance D1 between the first storage node contact SNC1 and the first bit line BL1 can be maximized.

The predetermined width W1, by which the first storage node contact SNC1 is deviated from the other side surface of the first landing plug contact LPC1, can be half to one time the width of the first bit line BL1.

Spacers SP2 can be additionally formed between the first storage node contacts SNC1 and the second interlayer dielectric 14. The spacers SP2 preferably can be preferably formed of a substance composed of a nitride-based layer and can have a thickness of about 10~50 Å.

The third interlayer dielectric 15 is deposited on the second interlayer dielectric 14. The third interlayer dielectric 15 can be formed of a substance composed of an oxide-based layer.

The second landing plug contacts LPC2 are formed in the third interlayer dielectric 15 to be electrically coupled to the first storage node contacts SNC1.

The second landing plug contacts LPC2 are formed to connect to the first storage node contacts SNC1 and to the overlying second storage node contacts SNC2. The second landing plug contacts LPC2 are sized to achieve sufficient electrical contact areas with the first storage node contacts SNC1 and the second storage node contacts SNC2 so that the resultant low contact resistance can be maintained between the second landing plug contacts LPC2 and the first storage node contacts SNC1 and the second storage node contacts SNC2.

Spacers SP3 can be additionally formed between the second landing plug contacts LPC2 and the third interlayer dielectric 15. The spacers SP3 can be preferably formed of a substance composed of a nitride-based layer and can have a thickness of about 10~50 Å.

The second bit lines BL2 are formed on the third interlayer dielectric 15 to extend in the same direction as the first bit lines BL1 and are respectively placed between the first bit lines BL1. The second bit lines BL2 are located over the drains D which are placed in even numbered rows. The second bit lines BL2 are electrically coupled to the drains D, placed in the even numbered rows, via second bit line contacts BLC2 which are formed through the third, second and first interlayer dielectrics 15, 14 and 13 and the capping layer 12.

The fourth interlayer dielectric 16 is formed on the third interlayer dielectric 15 to cover the second bit lines BL2. The fourth interlayer dielectric 16 can be preferably formed of a substance composed of an oxide-based layer.

The second storage node contacts SNC2 are formed in the fourth interlayer dielectric 16 to be electrically coupled to the second landing plug contacts LPC2. Each second storage node contact SNC2 is coupled to a portion of the second landing plug contact LPC2 in the state in which the second storage node contact SNC2 is deviated by the preselected width W2 from the other side surface facing away from one side surface of the second landing plug contact LPC2 adjoining the second bit line BL2 such that the distance D2 between the second storage node contact SNC2 and the second bit line BL2 is maximized.

The preselected width W2, by which the second storage node contact SNC2 is deviated from the other side surface of the second landing plug contact LPC2, can be half to one time the width of the second bit line BL2.

Spacers SP4 can be additionally formed between the second storage node contacts SNC2 and the fourth interlayer dielectric 16. The spacers SP4 can be preferably formed of a substance composed of a nitride-based layer and can have a thickness of about 10~50 Å.

Storage nodes 17 are formed on the second storage node contacts SNC2, and a dielectric layer 18 and a plate electrode 19 are deposited on the storage nodes 17, whereby the capacitors 100 are constituted.

A method for manufacturing a semiconductor device having the above structure will be described below.

FIGS. 3A through 3J are plan views explaining a method for manufacturing a semiconductor device in accordance with a second embodiment of the present invention, and FIGS. 4A through 4J are sectional views explaining the method for manufacturing a semiconductor device in accordance with the second embodiment of the present invention.

In FIGS. 4A through 4J, left sectional views are taken along the lines I-I' of FIGS. 3A through 3J, and right sectional views are taken along the lines II-IF of FIGS. 3A through 3J.

Figure 3A:
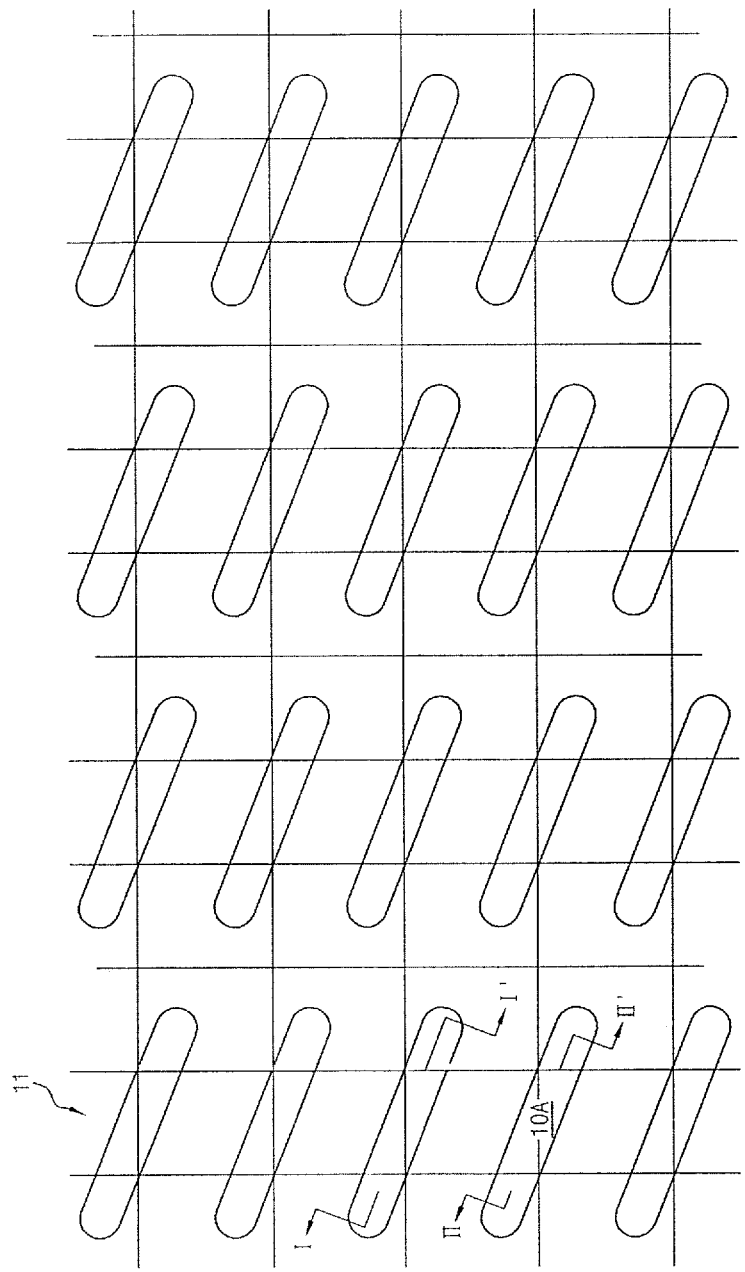
FIGS. 3A through 3J are plan views explaining a method for manufacturing a semiconductor device in accordance with a second embodiment of the present invention.
Figure 4A:
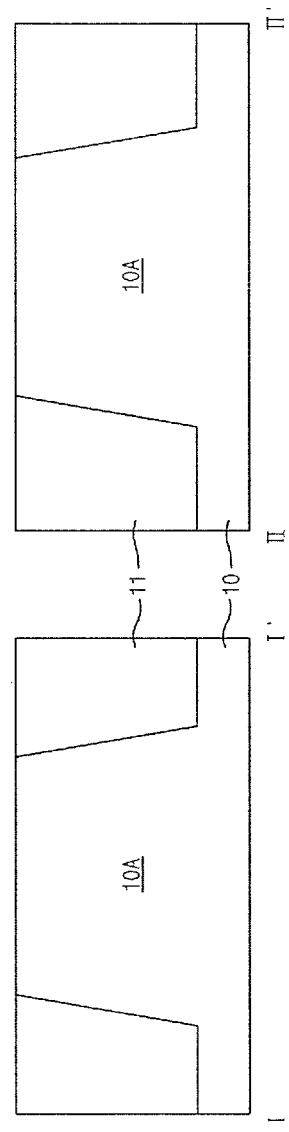

Referring to FIGS. 3A and 4A, an isolation structure 11 is formed in a substrate 10 which has a cell region and a peripheral region (not shown), in such a way so as to delimit active regions 10A.

In order to increase the degree of integration, the active regions 10A can be aligned not to extend in the vertical or horizontal direction but to be inclined to a diagonal direction by a predetermined angle.

Figure 3B:
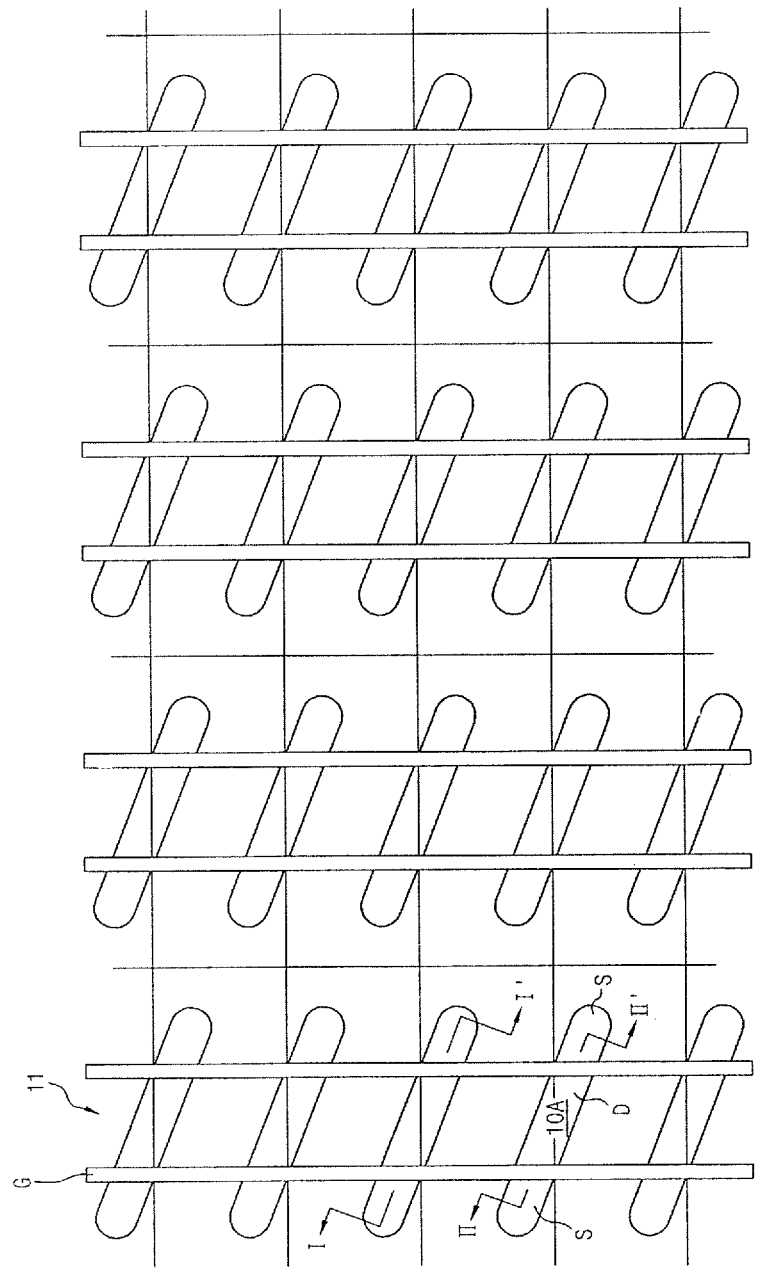
Figure 4B:
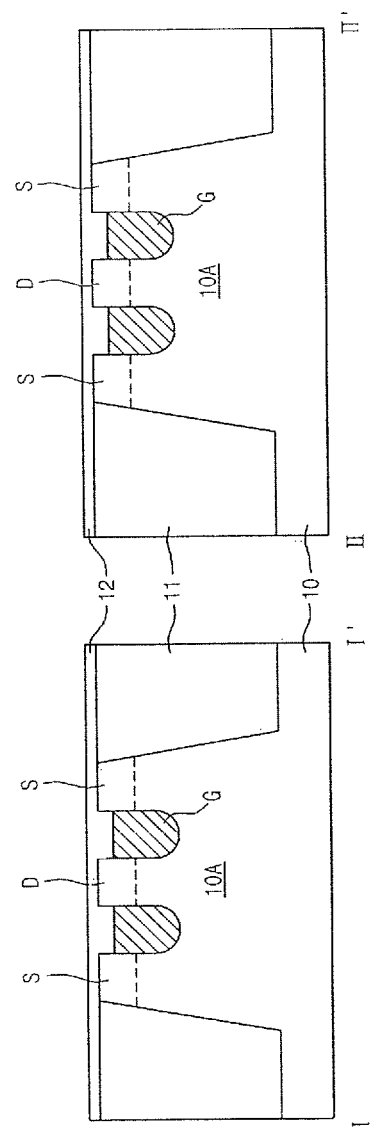

Referring to FIGS. 3B and 4B, gate lines G are formed in the cell region of the substrate 10 to extend across the active regions 10A.

It is preferred that the gate lines G be formed to have a buried structure so as to decrease bit line parasitic capacitance.

The gate lines G having the buried structure can be formed in a manner such that recesses are defined by etching the isolation structure 11 and the substrate 10 at gate forming zones, a gate insulation layer is formed on entire surfaces including the recesses, a gate electrode layer is formed on the gate insulation layer to fill the recesses, and the entire surface of the gate electrode layer is etched to allow the surface of the gate electrode layer to be positioned lower than the surface of the substrate 10.

The gate electrode layer can be formed of a metal such as TiN and WN.

If the gate electrode layer is formed of a metal in this way, since the work function and the energy band gap of the metal have values intermediate those of the work function and the energy band gap of an N+ polysilicon layer and a P+ polysilicon layer, advantages are provided in that the gate electrode layer can be utilized as midgap gates which can be used as the gate electrodes of an N-channel transistor and a P-channel transistor.

As a process for forming the gate electrode layer, a CVD (chemical vapor deposition) process or an ALD (atomic layer deposition) process can be employed.

Then, sources S and drains D are formed by implanting impurities into the active regions 10A on both sides of the gate lines G.

Next, in order to prevent oxidation and degradation of the gate electrode layer constituting the gate lines G in a subsequent thermal process, a liner layer (not shown) and a capping layer 12 are sequentially formed.

The liner layer can comprise an oxide layer, and the capping layer 12 can comprise a nitride layer or a combination of a nitride layer and an oxide layer.

Figure 3C:
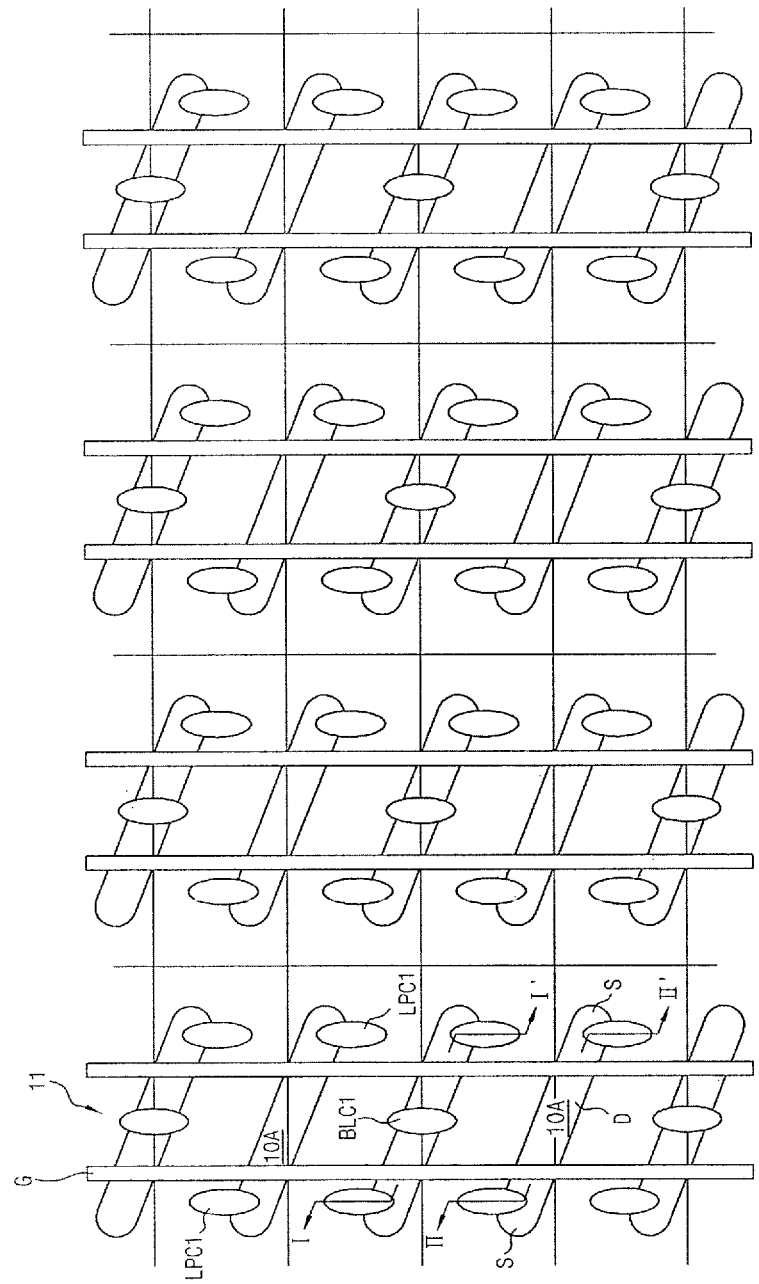
Figure 4C:
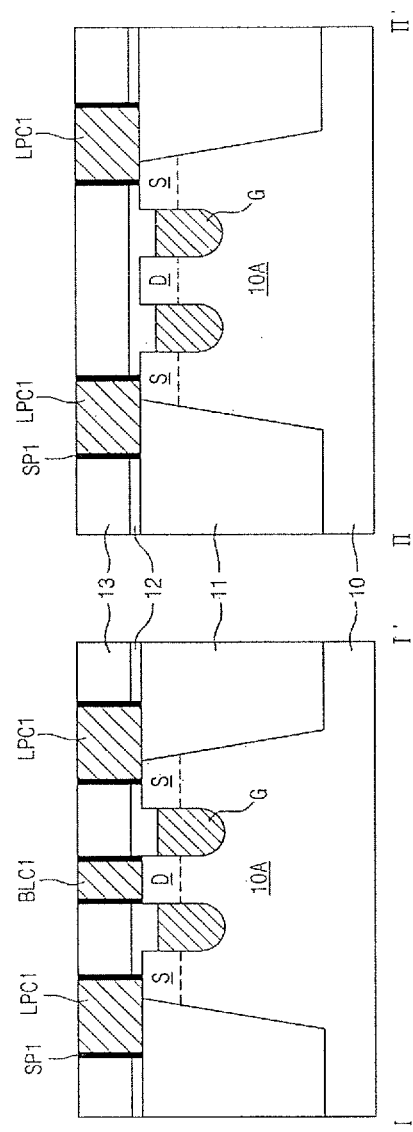

Referring to FIGS. 3C and 4C, a first interlayer dielectric 13 is formed on the capping layer 12. The first interlayer dielectric 13 can be preferably formed of a substance composed of an oxide-based layer.

Thereafter, first landing plug contacts LPC1, which are electrically coupled to the sources S, and first bit line contacts BLC1, which are electrically coupled to the drains D placed in odd numbered rows, are formed through the first interlayer dielectric 13 and the capping layer 12.

The first landing plug contacts LPC1 and the first bit line contacts BLC1 can be formed in a manner such that the first interlayer dielectric 13 and the capping layer 12 are patterned through a photolithographic process to define contact holes which expose the sources S and the drains D placed in the odd numbered rows, a conductive layer, for example, a polysilicon layer is formed on entire surfaces including the contact holes, and portions of the conductive layer, which are formed outside the contact holes, are removed.

Spacers SP1 can be additionally formed on the sidewalls of the contact holes before forming the conductive layer. The spacers SP1 can be preferably formed of a substance composed of a nitride-based layer and can have a thickness of about 10~50 Å.

The first bit line contacts BLC1 are not electrically coupled to the drains D placed in even numbered rows and electrically coupled to only the drains D placed in the odd numbered rows. According to this fact, the number of the first bit line contacts BLC1 corresponds to half the number of bit line contacts in the conventional art.

Figure 3D:
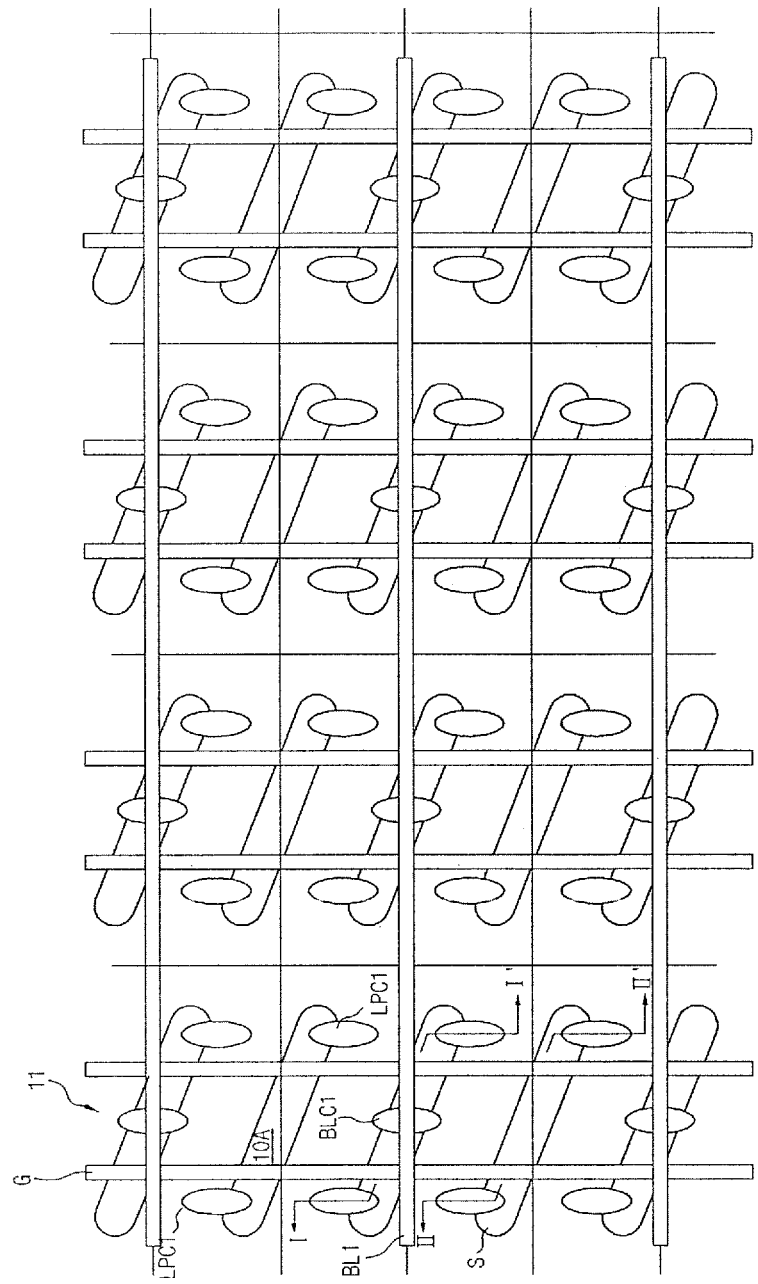
Figure 4D:
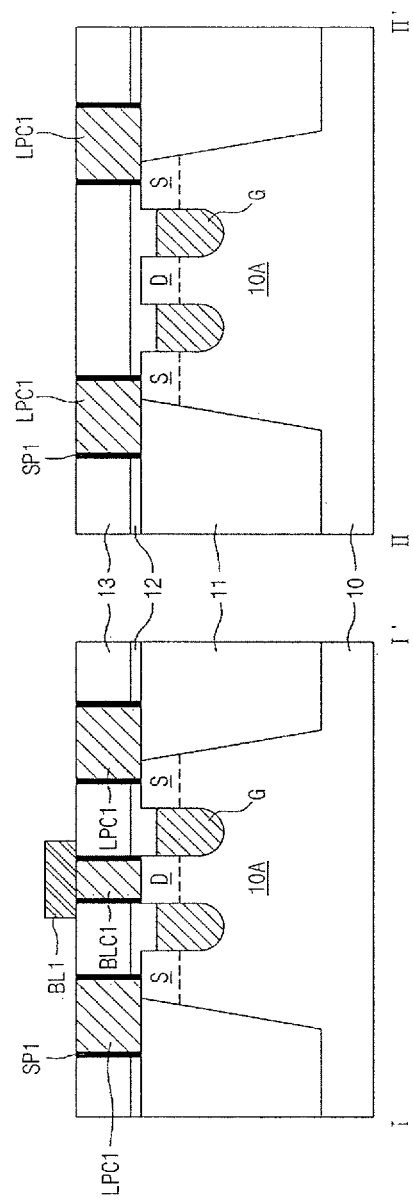

Referring to FIGS. 3D and 4D, first bit lines BL1 are formed on the first interlayer dielectric 13 to be electrically coupled to the first bit line contacts BLC1 and to extend in a direction perpendicular to the gate lines G.

The first bit lines BL1 are formed in the odd numbered rows so as to be electrically coupled to the first bit line contacts BLC1 which are electrically coupled to the drains D placed in the odd numbered rows.

According to this fact, the number of the first bit lines BL1 corresponds to half the number of bit lines in the conventional art, and the distance between the first bit lines BL1 corresponds to twice the distance between the bit lines in the conventional art.

The first bit lines BL1 can be formed simultaneously when forming gate electrodes in the peripheral region (not shown).

That is to say, the first bit lines BL1 can be formed in a manner such that, when forming a gate conductive layer in the peripheral region, the gate conductive layer is formed to extend to the cell region, and when forming gates by patterning the gate conductive layer, the gate conductive layer formed in the cell region is also patterned to form the first bit lines BL1.

Figure 3E:
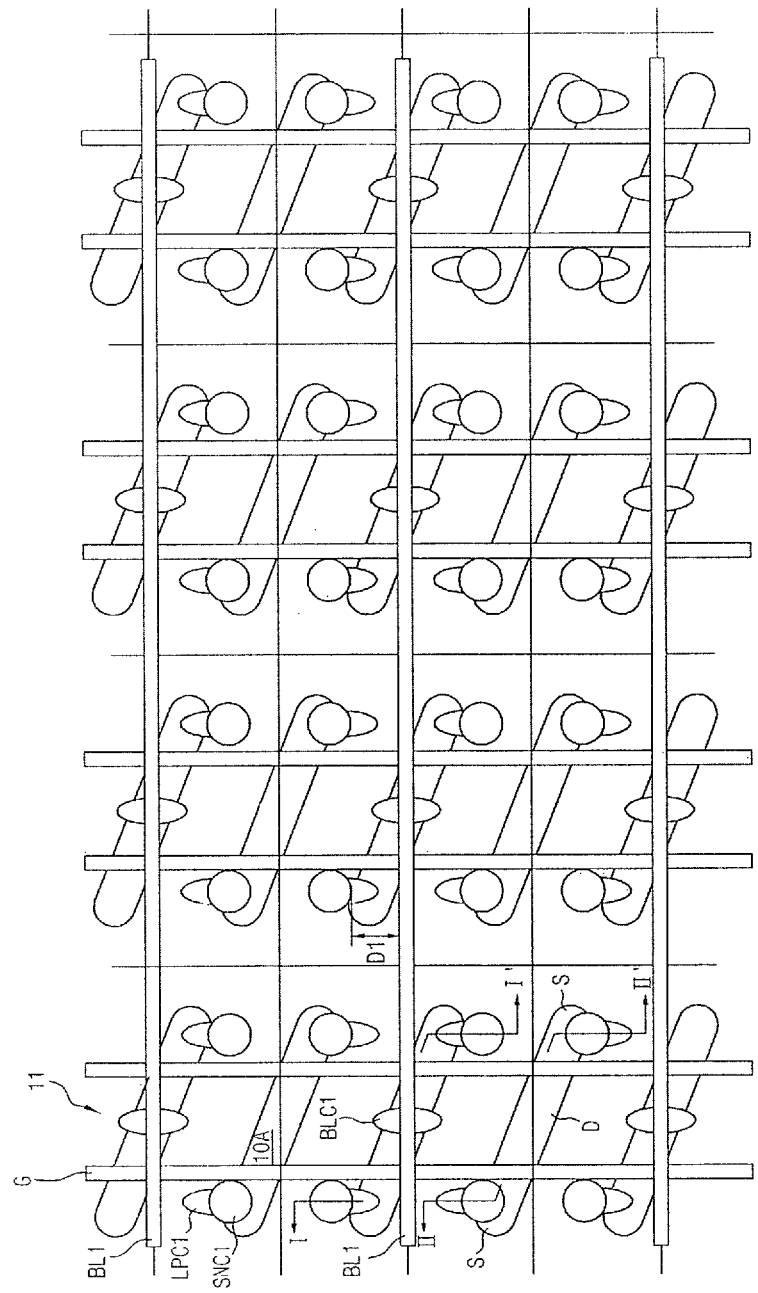
Figure 4E:
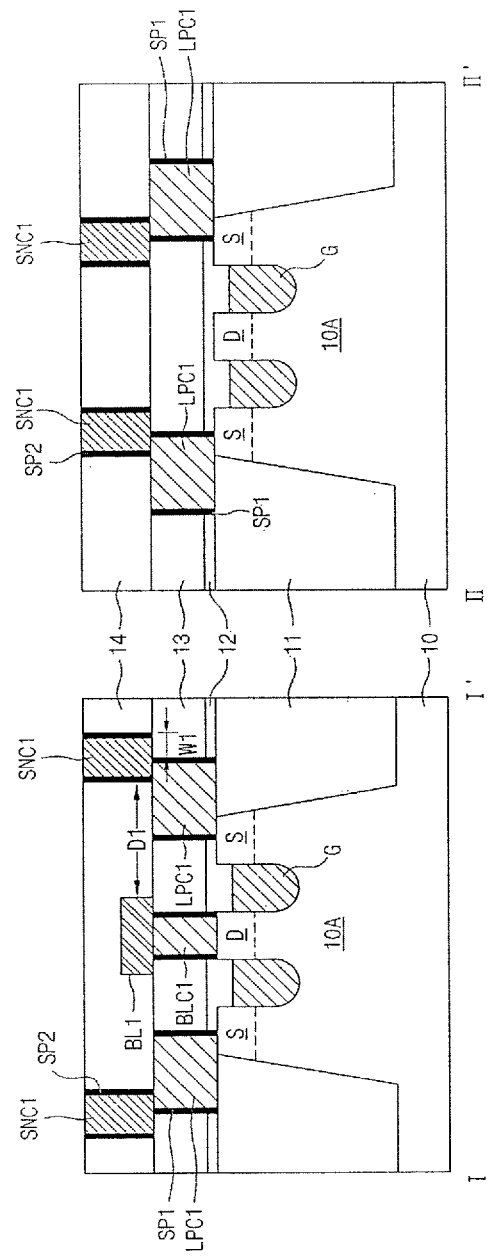

Referring to FIGS. 3E and 4E, a second interlayer dielectric 14 is formed on entire surfaces including the first bit lines BL1. The second interlayer dielectric 14 can be preferably formed of a substance composed of an oxide-based layer.

Thereupon, in order to remove surface unevenness that is caused in the second interlayer dielectric 14 due to the presence of the first bit lines BL1, a planarization process, for example, a CMP (chemical mechanical polishing) process can be conducted.

Then, first storage node contacts SNC1 are formed through the second interlayer dielectric 14 in a manner such that each first storage node contact SNC1 is coupled to a portion of the first landing plug contact LPC1 in a state in which the first storage node contact SNC1 is offset by a predetermined width W1 from the other side surface facing away from one side surface of the first landing plug contact LPC1 adjoining the first bit line BL1.

Since the distance between the first bit lines BL1 is twice the distance between the bit lines in the conventional art, the first storage node contacts SNC1 are formed not in a self-aligned contact (SAC) type with respect to the first bit lines BL1 but through a photolithographic process.

In other words, the first storage node contacts SNC1 can be formed in a manner such that the second interlayer dielectric 14 is patterned through a photolithographic process to define contact holes which expose portions of the first landing plug contacts LPC1 including the other side surfaces thereof facing away from one side surfaces thereof adjoining the first bit lines BL1 and portions of the first interlayer dielectric 13 adjoining the other side surfaces of the first landing plug contacts LPC1, a conductive layer, for example, a polysilicon layer is formed on entire surfaces including the contact holes, and portions of the conductive layer, which are formed outside the contact holes, are removed.

Spacers SP2 can be additionally formed on the sidewalls of the contact holes before forming the conductive layer. The spacers SP2 can be preferably formed of a substance composed of a nitride-based layer and can have a thickness of about 10~50Π.

Because the first storage node contacts SNC1 are formed to be offset by the predetermined width W1 from the other side surfaces of the first landing plug contacts LPC1 which face away from the first bit lines BL1, the distance D1 between the first storage node contact SNC1 and the first bit line BL1 is maximized.

The predetermined width W1, by which the first storage node contact SNC1 is offset from the other side surface of the first landing plug contact LPC1, can be half the width of the first bit line BL1.

Figure 3F:
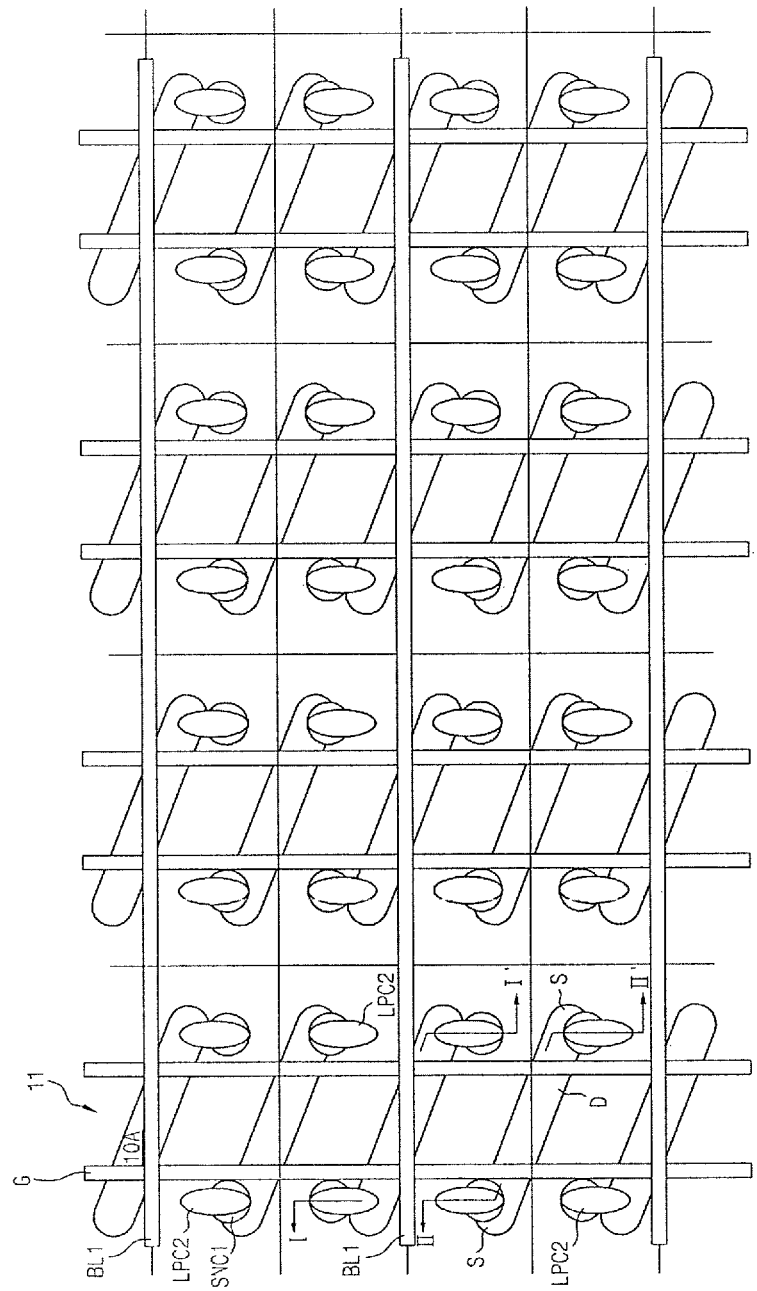
Figure 4F:
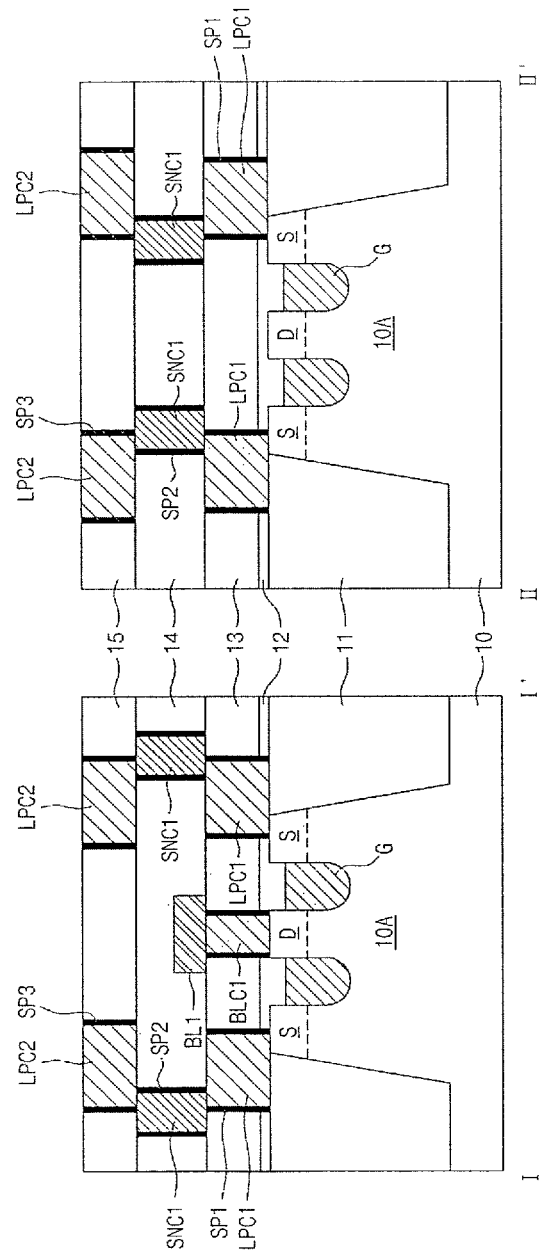

Referring to FIGS. 3F and 4F, a third interlayer dielectric 15 is formed on the second interlayer dielectric 14 including the first storage node contacts SNC1. The third interlayer dielectric 15 can be preferably formed of a substance composed of an oxide-based layer.

Next, second landing plug contacts LPC2 are formed through the third interlayer dielectric 15 to be electrically coupled to the first storage node contacts SNC1.

The second landing plug contacts LPC2 can be formed in a manner such that the third interlayer dielectric 15 is patterned through a photolithographic process to define contact holes which expose the first storage node contacts SNC1, a conductive layer, for example, a polysilicon layer is formed on entire surfaces including the contact holes, and portions of the conductive layer, which are formed outside the contact holes, are removed.

Spacers SP3 can be additionally formed on the sidewalls of the contact holes before forming the conductive layer. The spacers SP3 can be preferably formed of a substance composed of a nitride-based layer and can have a thickness of about 10~50 Å.

Figure 3G:
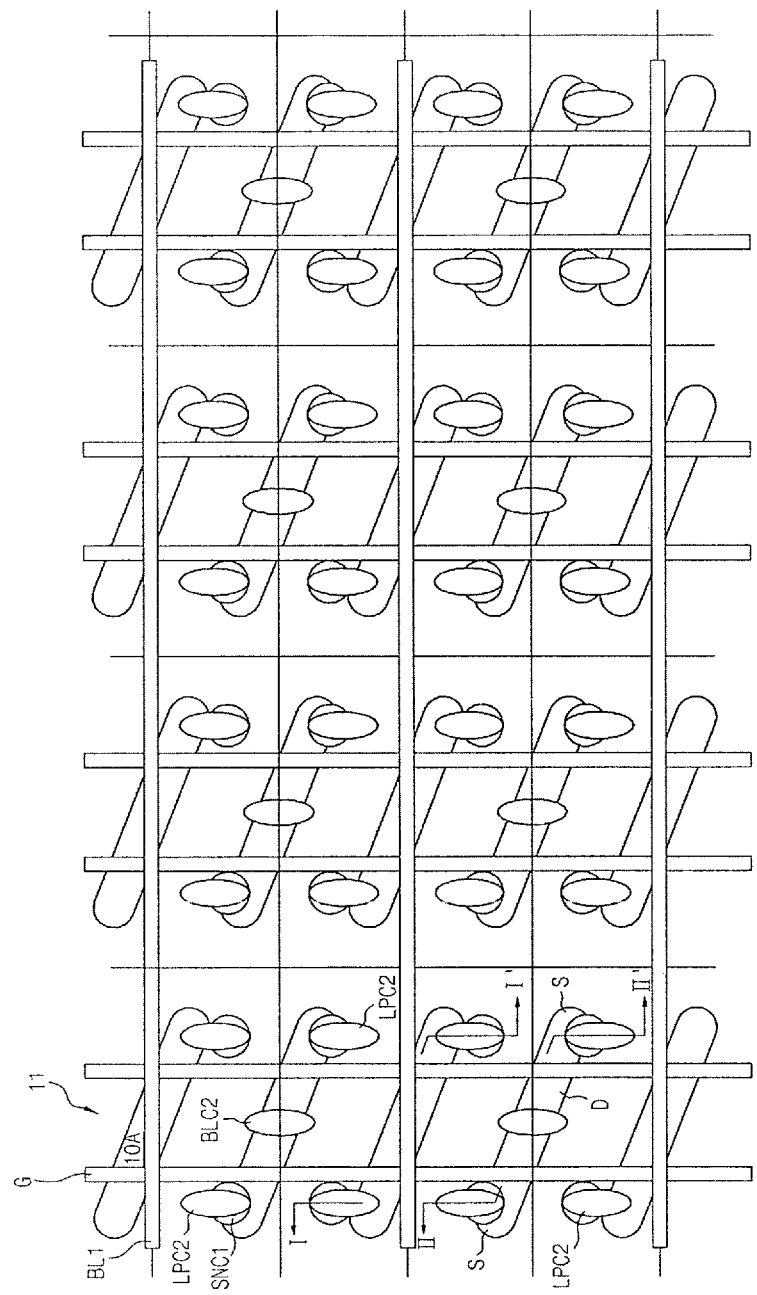
Figure 4G:
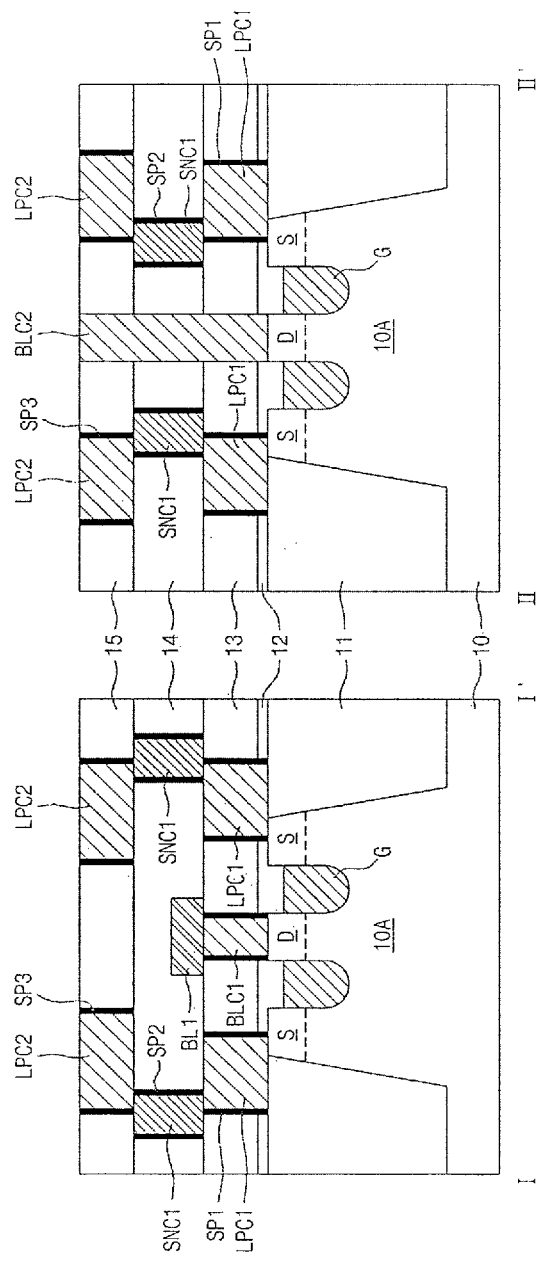

Referring to FIGS. 3G and 4G, second bit line contacts BLC2 are formed through the third, second and first interlayer dielectrics 15, 14 and 13 and the capping layer 12 to be electrically coupled to the drains D which are placed in even numbered rows and are not electrically coupled to the first bit line contacts BLC1.

The second bit line contacts BLC2 can be formed in a manner such that the third, second and first interlayer dielectrics 15, 14 and 13 and the capping layer 12 are patterned through a photolithographic process to define contact holes which expose the drains D placed in the even numbered rows, a conductive layer, for example, a polysilicon layer is formed on entire surfaces including the contact holes, and portions of the conductive layer, which are formed outside the contact holes, are removed.

The second bit line contacts BLC2 are not electrically coupled to the drains D placed in the odd numbered rows and electrically coupled to only the drains D placed in the even numbered rows. According to this fact, the number of the second bit line contacts BLC2 corresponds to half the number of bit line contacts in the conventional art.

The second bit line contacts BLC2 can be formed simultaneously when forming bit line contacts in the peripheral region (not shown).

That is to say, the second bit line contacts BLC2 can be formed in a manner such that, when defining bit line contact holes in the peripheral region, the third, second and first interlayer dielectrics 15, 14 and 13 and the capping layer 12 in the cell region are etched together to define contact holes, and when forming the bit line contacts in the peripheral region by filling a conductive layer in the bit line contact holes, the contact holes in the cell region are simultaneously filled with the conductive layer.

Although the second landing plug contacts LPC2 and the second bit line contacts BLC2 are formed through separate is processes in the present embodiment, it is conceivable that the second landing plug contacts LPC2 and the second bit line contacts BLC2 can be formed through a single process.

Figure 3H:
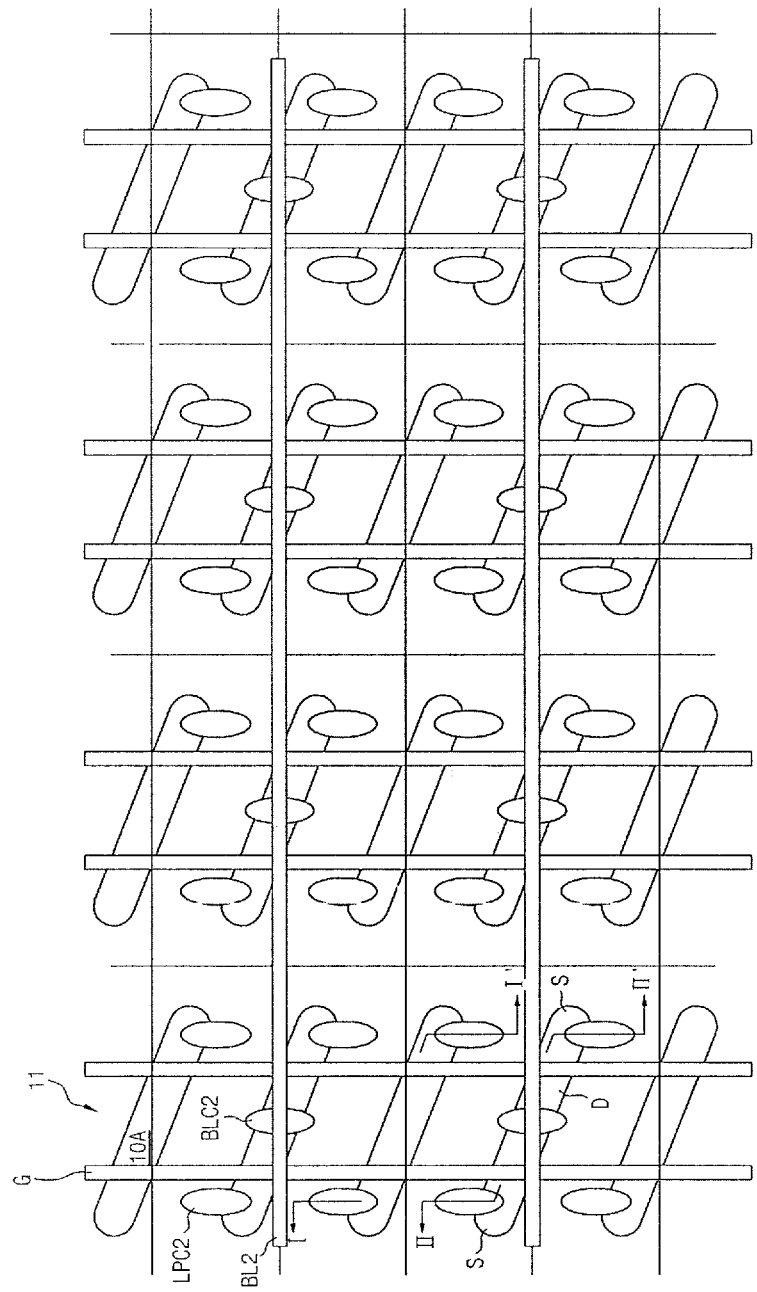

Referring to FIGS. 3H and 4H, second bit lines BL2 are formed on the third interlayer dielectric 15 including the second bit line contacts BLC2 to extend in the same direction as the first bit lines BL1 and to be respectively placed between the first bit lines BL1.

The second bit lines BL2 are electrically coupled to the drains D placed in the even numbered rows via the second bit line contacts BLC2. To this end, the second bit lines BL2 are formed in the even numbered rows. According to this fact, the number of the second bit lines BL2 corresponds to half the number of bit lines in the conventional art, and the distance between the second bit lines BL2 corresponds to twice the distance between the bit lines in the conventional art.

The second bit lines BL2 can be formed simultaneously when forming bit lines in the peripheral region. That is to say, the second bit lines BL2 can be formed in a manner such that, when forming a bit line conductive layer in the peripheral region, the bit line conductive layer is formed to extend to the cell region, and when forming bit lines in the peripheral region by patterning the bit line conductive layer, the bit line conductive layer formed in the cell region is also patterned to form the second bit lines BL2.

Figure 3I:
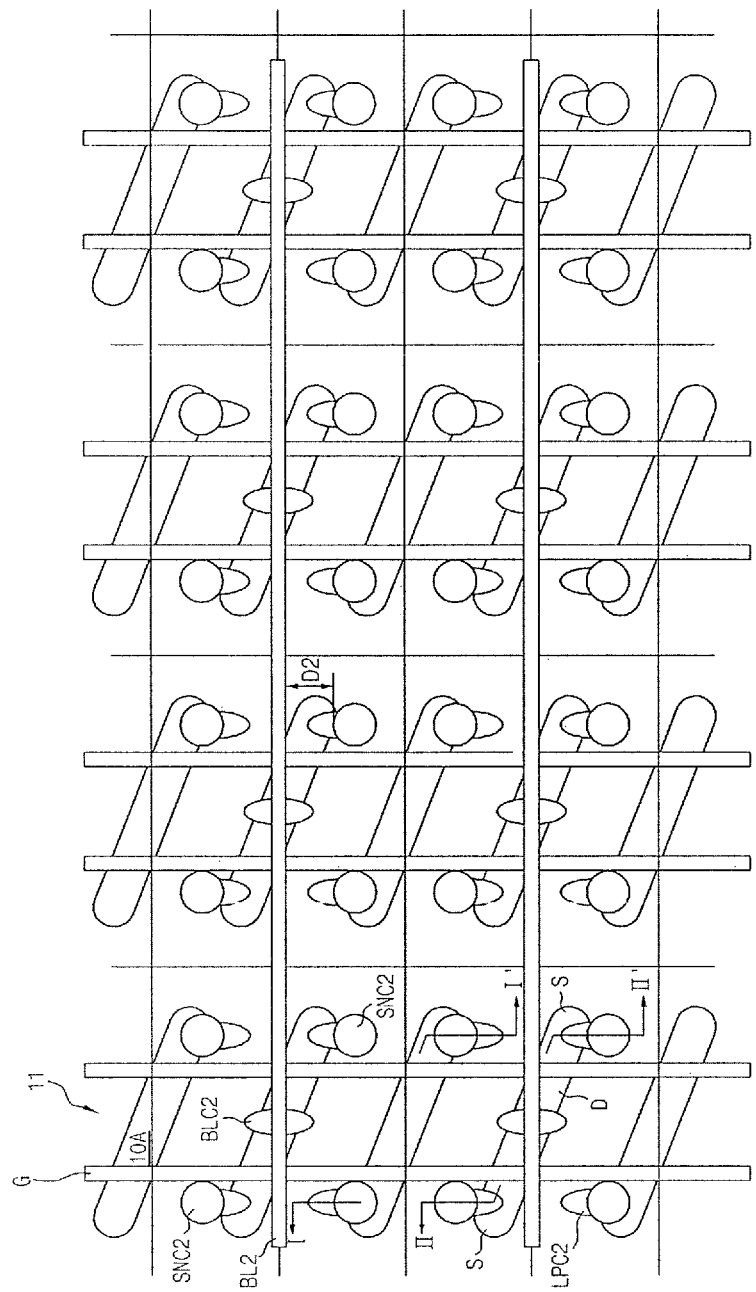
Figure 4I:
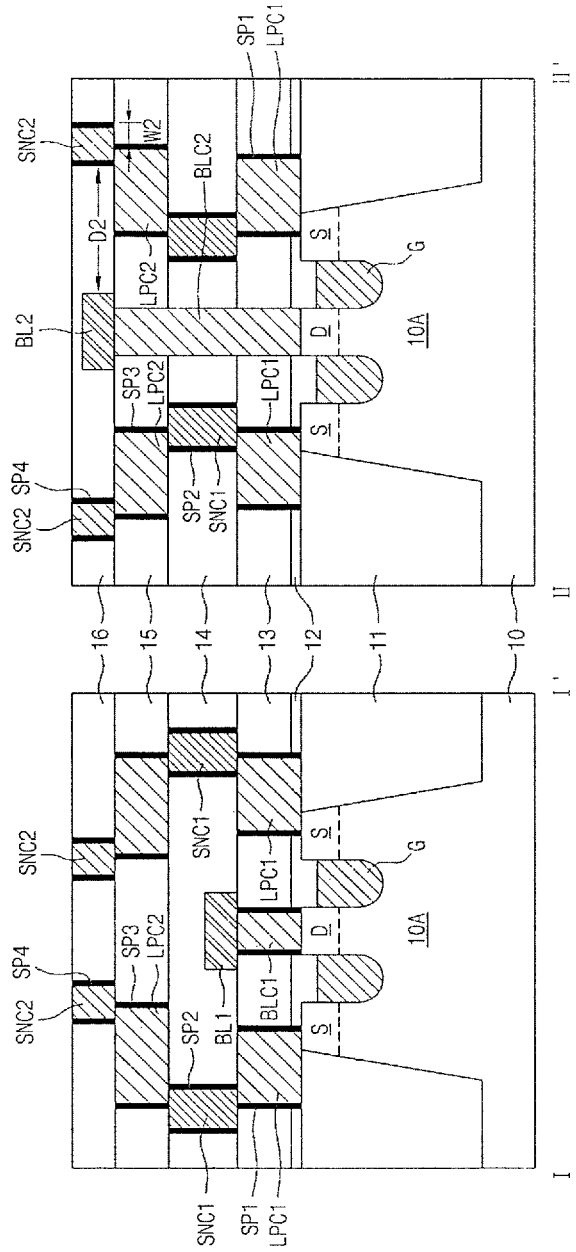

Referring to FIGS. 3I and 4I, a fourth interlayer dielectric 16 is formed on the third interlayer dielectric 15 including the second bit lines BL2. The fourth interlayer dielectric 16 can be preferably formed of a substance composed of an oxide-based layer.

Thereupon, in order to remove surface unevenness that is caused in the fourth interlayer dielectric 16 due to the presence of the second bit lines BL2, a planarization process, for example, a CMP process can be conducted.

Then, second storage node contacts SNC2 are formed through the fourth interlayer dielectric 16 in a manner such that each second storage node contact SNC2 is coupled to a portion of the second landing plug contact LPC2 in a state in which the second storage node contact SNC2 is offset by a preselected width W2 from the other side surface facing away from one side surface of the second landing plug contact LPC2 adjoining the second bit line BL2.

Since the distance between the second bit lines BL2 is twice the distance between the bit lines in the conventional art, the second storage node contacts SNC2 are formed not in a self-aligned contact (SAC) type with respect to the second bit lines BL2 but through a photolithographic process.

In other words, the second storage node contacts SNC2 can be formed in a manner such that the fourth interlayer dielectric 16 is patterned through a photolithographic process to define contact holes which expose portions of the second landing plug contacts LPC2 including the other side surfaces thereof facing away from one side surfaces thereof adjoining the second bit lines BL2 and portions of the third interlayer dielectric 15 adjoining the other side surfaces of the second landing plug contacts LPC2, a conductive layer, for example, a polysilicon layer is formed on entire surfaces including the contact holes, and portions of the conductive layer, which are formed outside the contact holes, are removed.

Spacers SP4 can be additionally formed on the sidewalls of the contact holes before forming the conductive layer. The spacers SP4 can be preferably formed of a substance composed of a nitride-based layer and can have a thickness of about 10~50 Å.

Because the second storage node contacts SNC2 are formed to be offset by the preselected width W2 from the other side surfaces of the second landing plug contacts LPC2 which face away from the second bit lines BL2, the distance D2 between the second storage node contact SNC2 and the second bit line BL2 is maximized.

The preselected width W2, by which the second storage node contact SNC2 is offset from the other side surface of the second landing plug contact LPC2, can be half to one times the width of the second bit line BL2.

Figure 3J:
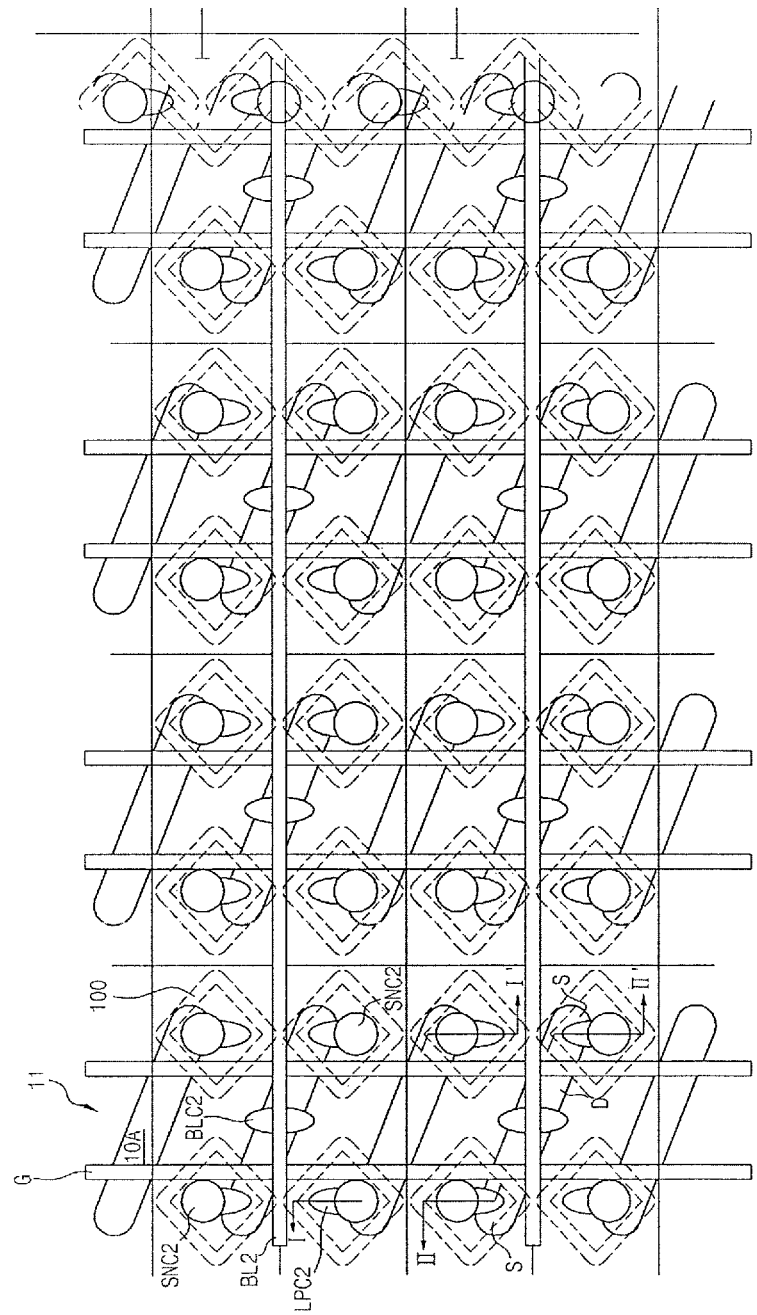
Figure 4J:
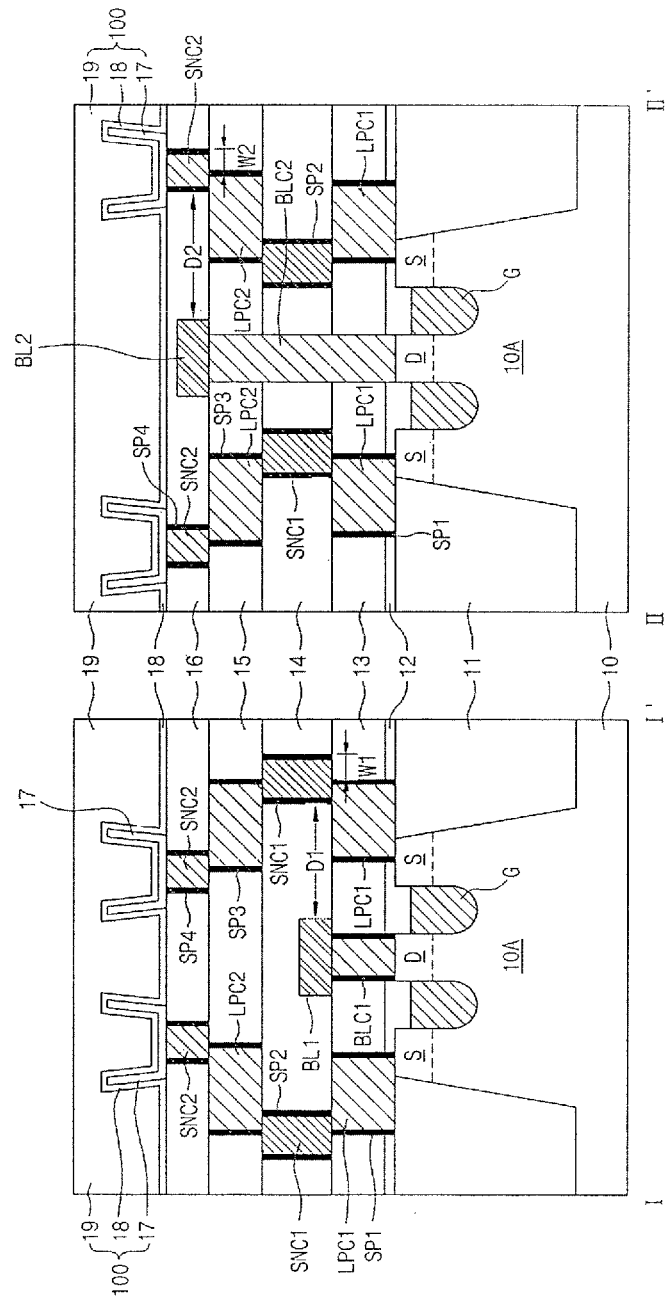

Referring to FIGS. 3J and 4J, capacitors 100 are formed by depositing storage nodes 17, a dielectric layer 18 and a plate electrode 19 on the second storage node contacts SNC2.

FIGS. 5A through 5J are sectional views explaining a method for manufacturing a semiconductor device in accordance with a third embodiment of the present invention.

Figure 5A:
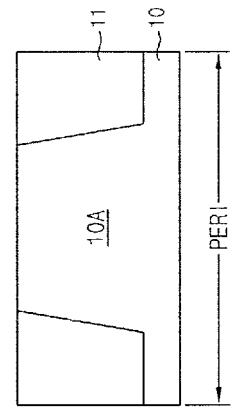
Figure 5A:
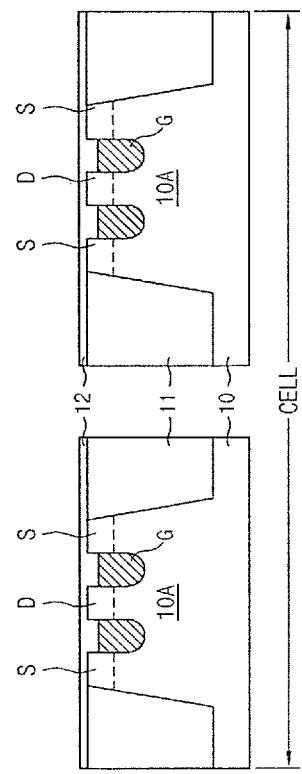

Referring to FIG. 5A, an isolation structure 11 is formed in a substrate 10 which has a cell region CELL and a peripheral region PERI, in such a way as to delimit active regions 10A.

In order to increase the degree of integration, the active regions 10A in the cell region CELL can be aligned not to extend in the vertical or horizontal direction but to be inclined to a diagonal direction by a predetermined angle.

Then, gate lines G are formed in the cell region CELL of the substrate 10 to extend across the active regions 10A.

It is preferred that the gate lines G be formed to have a buried structure so as to decrease bit line parasitic capacitance.

The gate lines G having the buried structure can be formed in a manner such that recesses are defined by etching the isolation structure 11 and the substrate 10 at gate forming zones, a gate insulation layer is formed on entire surfaces including the recesses, a gate electrode layer is formed on the gate insulation layer to fill the recesses, and the entire surface of the gate electrode layer is etched to allow the surface of the gate electrode layer to be positioned lower than the surface of the substrate 10.

The gate electrode layer can be formed of a metal such as TiN and WN.

If the gate electrode layer is formed of a metal in this way, since the work function and the energy band gap of the metal have values intermediate those of the work function and the energy band gap of an N+ polysilicon layer and a P+ polysilicon layer, advantages are provided in that the gate electrode layer can be utilized as midgap gates which can be used as the gate electrodes of an N-channel transistor and a P-channel transistor.

As a process for forming the gate electrode layer, a CVD process or an ALD process can be employed.

Then, sources S and drains D are formed by implanting impurities into the active regions 10A on both sides of the gate lines G.

Next, in order to prevent oxidation and degradation of the gate electrode layer constituting the gate lines G in a subsequent thermal process, a liner layer (not shown) and a capping layer 12 are sequentially formed.

The liner layer can comprise an oxide layer, and the capping layer 12 can comprise a nitride layer or a combination of a nitride layer and an oxide layer.

Next, the liner layer and the capping layer 12 which are formed in the peripheral region PERI are removed.

Figure 5B:
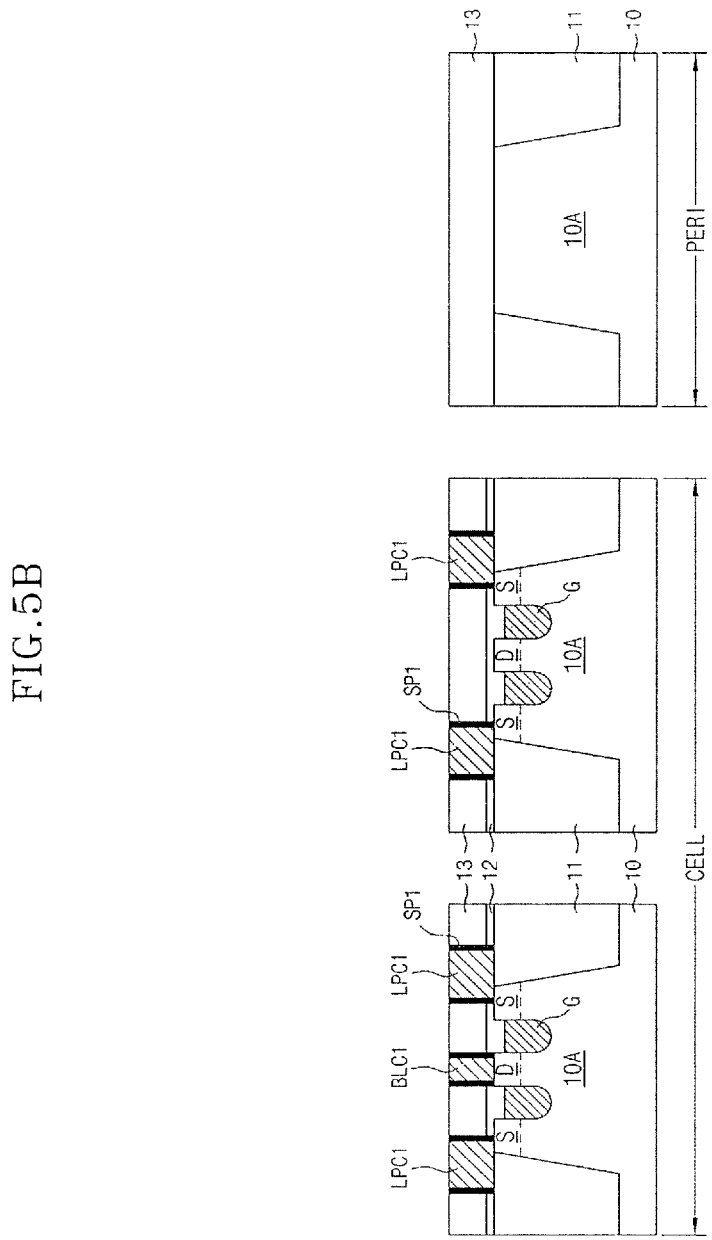

Referring to FIG. 5B, a first interlayer dielectric 13 is formed in the cell region CELL and the peripheral region PERI of the resultant substrate 10. The first interlayer dielectric 13 can be preferably formed of a substance composed of an oxide-based layer.

Thereafter, in the cell region CELL, first landing plug contacts LPC1, which are electrically coupled to the sources S, and first bit line contacts BLC1, which are electrically coupled to the drains D placed in odd numbered rows, are formed through the first interlayer dielectric 13 and the capping layer 12.

The first landing plug contacts LPC1 and the first bit line contacts BLC1 can be formed in a manner such that the first interlayer dielectric 13 and the capping layer 12 in the cell region CELL are patterned through a photolithographic process to define contact holes which expose the sources S and the drains D placed in the odd numbered rows, a conductive layer, for example, a polysilicon layer is formed on entire surfaces including the contact holes, and portions of the conductive layer, which are formed outside the contact holes, are removed.

Spacers SP1 can be additionally formed on the sidewalls of the contact holes before forming the conductive layer. The spacers SP1 can be preferably formed of a substance composed of a nitride-based layer and can have a thickness of about 10~50 Å.

The first bit line contacts BLC1 are not electrically coupled to the drains D placed in even numbered rows and electrically coupled to only the drains D placed in the odd numbered rows. According to this fact, the number of the first bit line contacts BLC1 corresponds to half the number of bit line contacts in the conventional art.

Figure 5C:
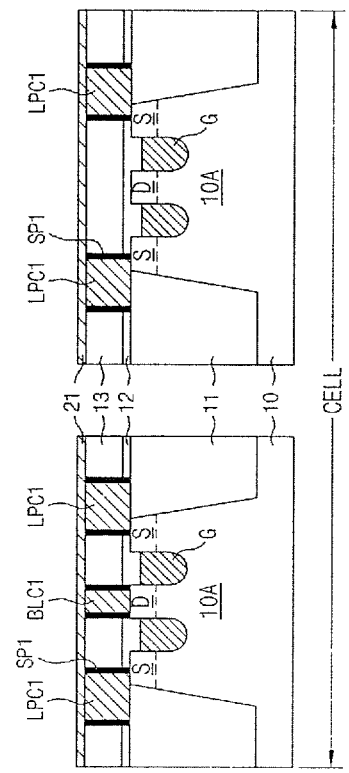

Referring to FIG. 5C, the first interlayer dielectric 13 which is formed in the peripheral region PERI is removed. Then, a gate insulation layer 20 is formed in the peripheral region PERI of the substrate 10, and a first conductive layer 21 for gate electrodes is formed in the cell region CELL and the peripheral region PERI.

A polysilicon layer can be used as the first conductive layer 21.

Figure 5D:
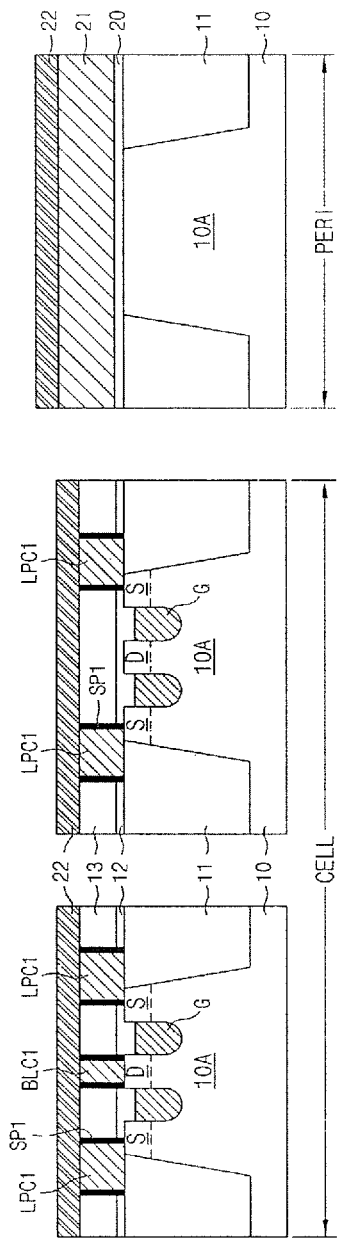

Referring to FIG. 5D, the first conductive layer 21 which is formed in the cell region CELL is removed, and a second conductive layer 22 and a hard mask layer (not shown) are deposited in the cell region CELL and the peripheral region PERI.

The second conductive layer 22 can comprise a metal layer or a metal silicide layer, and the hard mask layer can comprise a nitride layer.

Figure 5E:
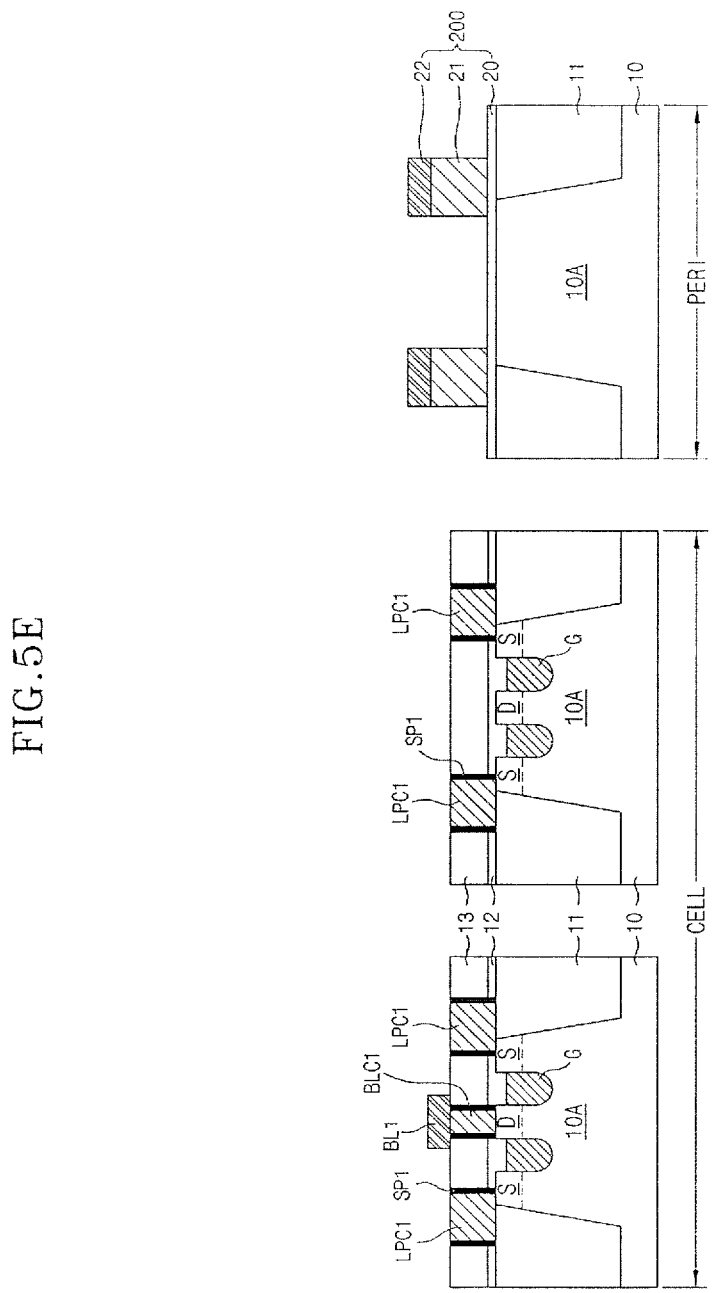

Referring to FIG. 5E, by patterning the hard mask layer and the second and first conductive layers 22 and 21 in the cell region CELL and the peripheral region PERI through a photolithographic process, first bit lines BL1 are formed in the cell region CELL to be electrically coupled to the first bit line contacts BLC1 and to extend in a direction perpendicular to the gate lines G, and gates 200 are formed in the peripheral region PERI.

The first bit lines BL1 which are formed in the cell region CELL are formed in the odd numbered rows so as to be electrically coupled to the first bit line contacts BLC1 which are electrically coupled to the drains D placed in the odd numbered rows. According to this fact, the number of the first bit lines BL1 corresponds to half the number of bit lines in the conventional art, and the distance between the first bit lines BL1 corresponds to twice the distance between the bit lines in the conventional art.

Figure 5F:
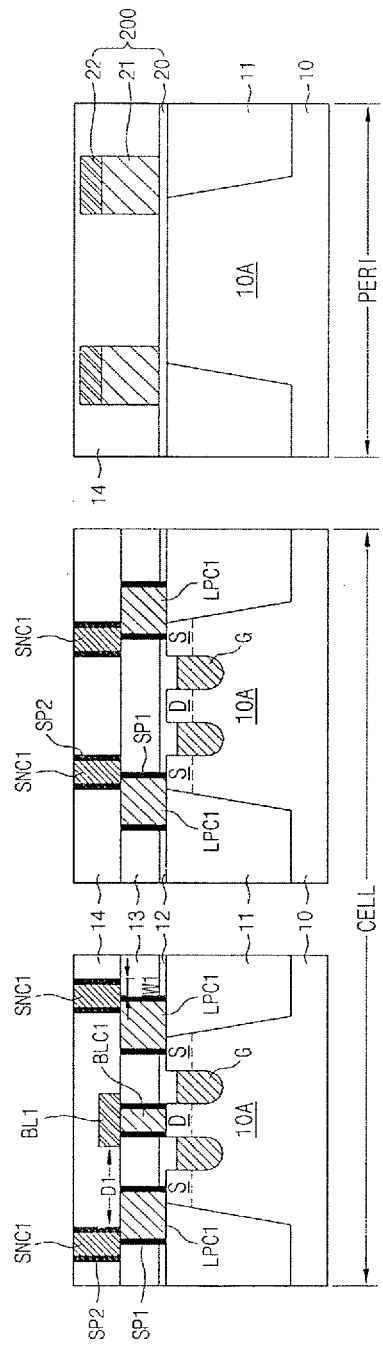

Referring to FIG. 5F, a second interlayer dielectric 14 is formed in the cell region CELL and the peripheral region PERI to cover the first bit lines BL1 and the gates 200. The second interlayer dielectric 14 can be preferably formed of a substance composed of an oxide-based layer.

Thereupon, in order to remove surface unevenness that is caused in the second interlayer dielectric 14 due to the presence of the first bit lines BL1 and the gates 200, a planarization process, for example, a CMP process can be conducted.

Then, first storage node contacts SNC1 are formed through the second interlayer dielectric 14 in the cell region CELL in a manner such that each first storage node contact SNC1 is coupled to a portion of the first landing plug contact LPC1 in a state in which the first storage node contact SNC1 is offset by a predetermined width W1 from the other side surface facing away from one side surface of the first landing plug contact LPC1 adjoining the first bit line BL1.

Since the distance between the first bit lines BL1 is twice the distance between the bit lines in the conventional art, the first storage node contacts SNC1 are formed not in a self-aligned contact (SAC) type with respect to the first bit lines BL1 but through a photolithographic process.

In other words, the first storage node contacts SNC1 can be formed in a manner such that the second interlayer dielectric 14 is patterned through a photolithographic process to define contact holes which expose portions of the first landing plug contacts LPC1 including the other side surfaces thereof facing away from one side surfaces thereof adjoining the first bit lines BL1 and portions of the first interlayer dielectric 13 adjoining the other side surfaces of the first landing plug contacts LPC1, a conductive layer, for example, a polysilicon layer is formed on entire surfaces including the contact holes, and portions of the conductive layer, which are formed outside the contact holes, are removed.

Spacers SP2 can be additionally formed on the sidewalls of the contact holes before forming the conductive layer. The spacers SP2 can be preferably formed of a substance composed of a nitride-based layer and can have a thickness of about 10~50 Å.

Because the first storage node contacts SNC1 are formed to be offset by the predetermined width W1 from the other side surfaces of the first landing plug contacts LPC1 which face away from the first bit lines BL1, the distance D1 between the first storage node contact SNC1 and the first bit line BL1 is maximized.

The predetermined width W1, by which the first storage node contact SNC1 is offset from the other side surface of the first landing plug contact LPC1, can be half to one time the width of the first bit line BL1.

Figure 5G:
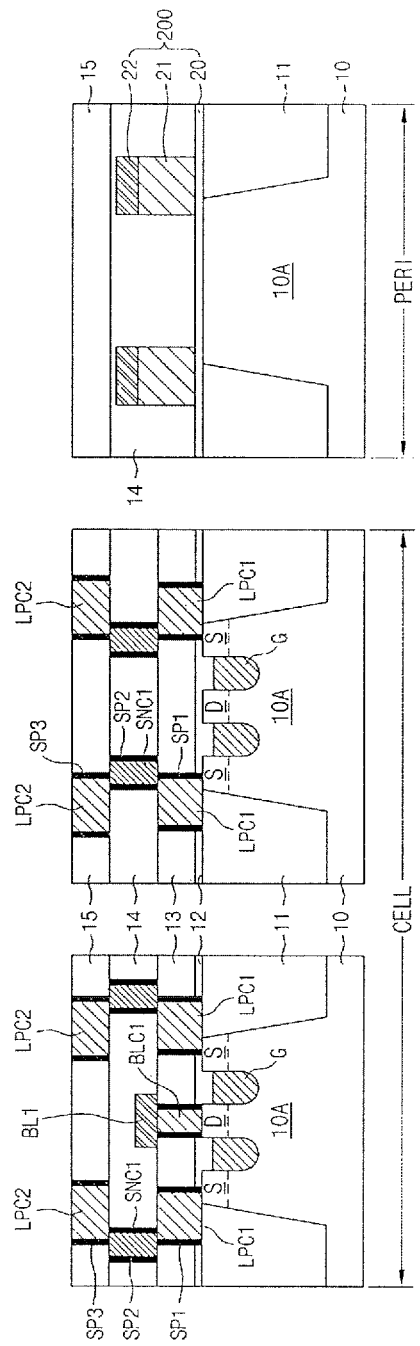

Referring to FIG. 5G, a third interlayer dielectric 15 is formed in the cell region CELL and the peripheral region PERI. The third interlayer dielectric 15 can be preferably formed of a substance composed of an oxide-based layer.

Next, second landing plug contacts LPC2 are formed through the third interlayer dielectric 15 in the cell region CELL to be electrically coupled to the first storage node contacts SNC1.

The second landing plug contacts LPC2 can be formed in a manner such that the third interlayer dielectric 15 in the cell region CELL is patterned through a photolithographic process to define contact holes which expose the first storage node contacts SNC1, a conductive layer, for example, a polysilicon layer is formed on entire surfaces including the contact holes, and portions of the conductive layer, which are formed outside the contact holes, are removed.

Spacers SP3 can be additionally formed on the sidewalls of the contact holes before forming the conductive layer. The spacers SP3 can be preferably formed of a substance composed of a nitride-based layer and can have a thickness of about 10~50 Å.

Figure 5H:
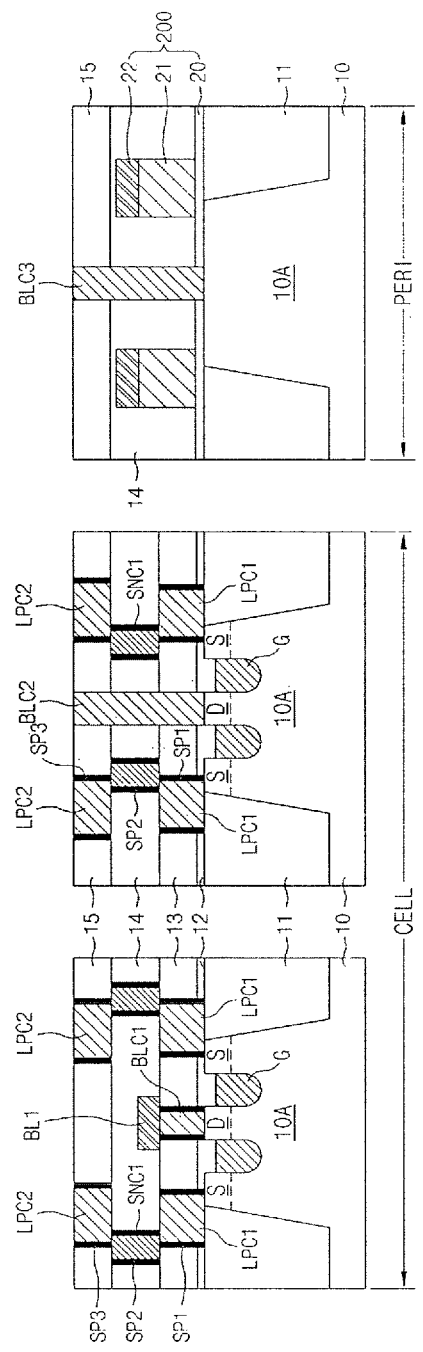

Referring to FIG. 5H, by patterning the third, second and first interlayer dielectrics 15, 14 and 13 and the capping layer 12 in the cell region CELL and the third and second interlayer dielectrics 15 and 14 and the gate insulation layer 20 in the peripheral region PERI through a photolithographic process, contact holes are defined to expose the drains D placed in the even numbered rows in the cell region CELL and portions of the substrate 10 between the gates 200 in the peripheral region PERI.

Next, a conductive layer, for example, a polysilicon layer is formed on entire surfaces of the contact holes, and portions of the conductive layer, which are formed outside the contact holes, are removed. Through this, second bit line contacts BLC2 are formed in the cell region CELL, and third bit line contacts BLC3 are formed in the peripheral region PERI.

The second bit line contacts BLC2 are not electrically coupled to the drains D placed in the odd numbered rows and electrically coupled to only the drains D placed in the even numbered rows. According to this fact, the number of the second bit line contacts BLC2 corresponds to half the number of bit line contacts in the conventional art.

Although the second landing plug contacts LPC2 and the second and third bit line contacts BLC2 and BLC3 are formed through separate processes in the illustrated embodiment, it is conceivable that the second landing plug contacts LPC2 and the second and third bit line contacts BLC2 and BLC3 can be formed through a single process.

Figure 5I:
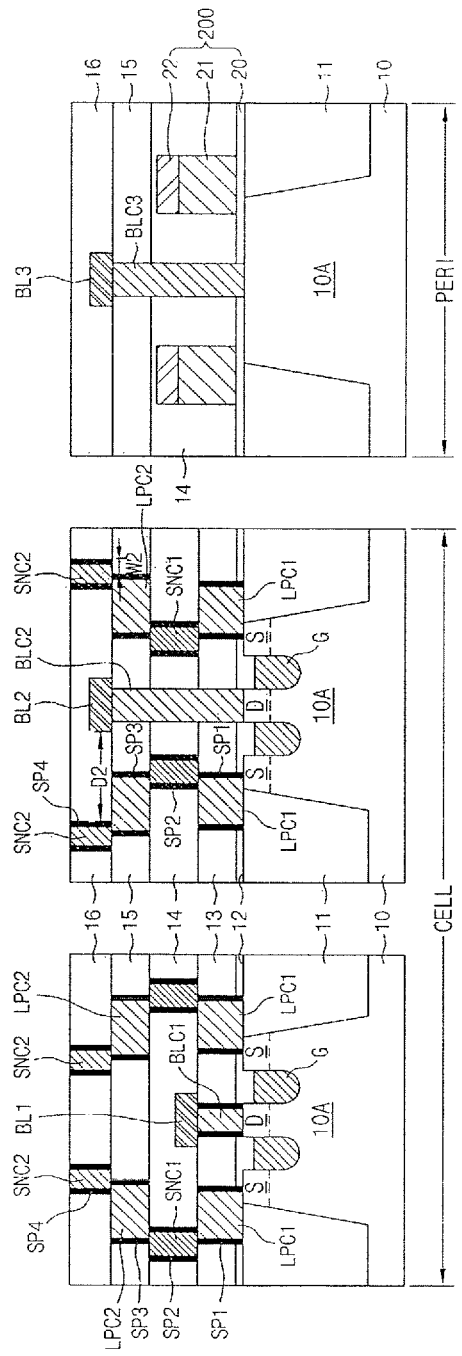

Referring to FIG. 5I, second bit lines BL2 are formed on the third interlayer dielectric 15 in the cell region CELL to be electrically coupled to the second bit line contacts BLC2, to extend in the same direction as the first bit lines BL1 and to be respectively placed between the first bit lines BL1. Third bit lines BL3 are formed on the third interlayer dielectric 15 in the peripheral region PERI to be electrically coupled to the third bit line contacts BLC3.

The second bit lines BL2 are electrically coupled to the drains D placed in the even numbered rows via the second bit line contacts BLC2. To this end, the second bit lines BL2 are formed in the even numbered rows. According to this fact, the number of the second bit lines BL2 corresponds to half the number of bit lines in the conventional art, and the distance between the second bit lines BL2 corresponds to twice the distance between the bit lines in the conventional art.

Thereafter, a fourth interlayer dielectric 16 is formed in the cell region CELL and the peripheral region PERI to cover the second and third bit lines BL2 and BL3. The fourth interlayer dielectric 16 can be preferably formed of a substance composed of an oxide-based layer.

Thereupon, in order to remove surface unevenness that is caused in the fourth interlayer dielectric 16 due to the presence of the second and third bit lines BL2 and BL3, a planarization process, for example, a CMP process can be conducted.

Then, second storage node contacts SNC2 are formed through the fourth interlayer dielectric 16 in the cell region CELL in a manner such that each second storage node contact SNC2 is coupled to a portion of the second landing plug contact LPC2 in a state in which the second storage node contact SNC2 is offset by a preselected width W2 from the other side surface facing away from one side surface of the second landing plug contact LPC2 adjoining the second bit line BL2.

Since the distance between the second bit lines BL2 is twice the distance between the bit lines in the conventional art, the second storage node contacts SNC2 are formed not in a self-aligned contact (SAC) type with respect to the second bit lines BL2 but through a photolithographic process.

In other words, the second storage node contacts SNC2 can be formed in a manner such that the fourth interlayer dielectric 16 is patterned through a photolithographic process to define contact holes which expose portions of the second landing plug contacts LPC2 including the other side surfaces thereof facing away from one side surfaces thereof adjoining the second bit lines BL2 and portions of the third interlayer dielectric 15 adjoining the other side surfaces of the second landing plug contacts LPC2, a conductive layer, for example, a polysilicon layer is formed on is entire surfaces including the contact holes, and portions of the conductive layer, which are formed outside the contact holes, are removed.

Spacers SP4 can be additionally formed on the sidewalls of the contact holes before forming the conductive layer. The spacers SP4 can be preferably formed of a substance composed of a nitride-based layer and can have a thickness of about 10~50 Å.

Because the second storage node contacts SNC2 are formed to be offset by the preselected width W2 from the other side surfaces of the second landing plug contacts LPC2 which face away from the second bit lines BL2, the distance D2 between the second storage node contact SNC2 and the second bit line BL2 is maximized.

The preselected width W2, by which the second storage node contact SNC2 is offset from the other side surface of the second landing plug contact LPC2, can be half to one time the width of the second bit line BL2.

Referring to FIG. 5J, capacitors 100 are formed by depositing storage nodes 17, a dielectric layer 18 and a plate electrode 19 on the second storage node contacts SNC2.

Although it was described in the above embodiment that bit lines are formed in different layers to be alternately arranged in a staggered manner only in the cell region CELL and are not formed in different layers not to be alternately arranged in a staggered manner in the peripheral region PERI, it can be envisaged that the bit lines can be formed in different layers to be alternately arranged in a staggered manner in both the cell region CELL and the peripheral region PERI. To this end, the gate 200 in the peripheral region PERI can be formed earlier than the first bit lines BL1 in the cell region CELL, and the third bit lines BL3 can be formed in different layers to be alternately arranged in a staggered manner such that the third bit lines BL3 in odd numbered rows are formed when forming the first bit lines BL1 in the cell region CELL and the third bit lines BL3 in even numbered rows are formed when forming the second bit lines BL2 in the cell region CELL.

As is apparent from the above description, in the present invention, bit lines are formed in different layers in such a way as to be alternately arranged in a staggered manner so that the distance between the bit lines in each layer is increased, and storage node contacts for connecting a substrate and capacitors are formed in the different layers in such a way as to be connected by landing plug contacts so that the distance between the storage node contact and the bit line can be maximized. As a consequence, the capacitance between the bit line and a storage node can be decreased to $\frac{1}{5}$ to $\frac{1}{10}$ compared to the conventional art.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming a first interlayer dielectric (ID1) in a cell region on a substrate;
    forming first landing plug contacts (LPC1) through the ID1 and connected to the substrate;
    forming first bit lines (BL1) on the ID1 that extend substantially along a first direction on the ID1;
    forming a second interlayer dielectric (ID2) to cover the BL1;
    forming first storage node contacts (SNC1) through the ID2 and electrically coupled to the LPC1 wherein the SNC1 are offset at a first predetermined width (W1) from the LPC1 in a direction away from the BL1;
    forming a third interlayer dielectric (ID3) on the ID2;
    forming second landing plug contacts (LPC2) through the ID3 and electrically coupled to the SNC1;
    forming second bit lines (BL2) on the ID3 that extend substantially along the first direction so that the BL2 on the ID3 are substantially in parallel to the BL1 on the ID1 and are aligned between the BL1;

forming a fourth interlayer dielectric (ID4) to cover the second bit lines; and forming second storage node contacts (SNC2) through the ID4 and electrically coupled to the LPC2 wherein the SNC2 are offset at a second predetermined width (W2) from the LPC2 in a direction away from the BL2.

2. The method according to claim 1, wherein both the ID2 and ID4 are composed of an oxide layer.

3. The method according to claim 1, further comprising the step of forming capacitors on the SNC2 after forming the SNC2.

4. The method according to claim 1, wherein the step of forming the LPC1 comprises the steps of:
defining contact holes by patterning the ID1 using a photolithographic process to expose portions of the substrate;
forming a conductive layer on the ID1 and within the contact holes; and
removing portions of the conductive layer which are formed outside the contact holes.

5. The method according to claim 4, further comprising the step of forming spacers on sidewalls of the contact holes before forming the conductive layer.

6. The method according to claim 1, wherein the step of forming the SNC1 comprises the steps of:
defining contact holes by patterning the ID2 using a photolithographic process to expose portions of the LPC1 such that the contact holes are offset at a first predetermined width (W1) from the LPC1 in a direction away from the BL1;
forming a conductive layer on the ID2 and within the contact holes; and
removing portions of the conductive layer which are formed outside the contact holes.

7. The method according to claim 6, further comprising the step of forming spacers on sidewalls of the contact holes before forming the conductive layer.

8. The method according to claim 1, wherein the step of forming the LPC2 comprises the steps of:
defining contact holes by patterning the ID3 using a photolithographic process to expose the SNC1;
forming a conductive layer on the ID3 and within the contact holes; and
removing portions of the conductive layer which are formed outside the contact holes.

9. The method according to claim 8, further comprising the step of forming spacers on sidewalls of the contact holes before forming the conductive layer.

10. The method according to claim 4, wherein the step of forming the SNC2 comprises the steps of:
defining contact holes by patterning the ID4 using a photolithographic process to expose portions of the LPC2 so that the contact holes are offset at a second predetermined width (W2) from the LPC2 in a direction away from the BL2;
forming a conductive layer on the ID4 and within the contact holes; and
removing portions of the conductive layer which are formed outside the contact holes.

11. The method according to claim 10, further comprising the step of forming spacers on sidewalls of the contact holes before forming the conductive layer.

12. The method according to claim 1, wherein, in the step of forming the LPC1, first bit line contacts (BLC1) are formed through the ID1 and are placed under the BL1 and are connected to the substrate.

13. The method according to claim 1, further comprises the step of forming second bit line contacts (BLC2) through the ID3, ID2, and ID1 such that the BLC2 is be placed under the BL2 and connected to the substrate, wherein forming the BLC2 is performed after the step of forming the LPC2.

14. The method according to claim 13, wherein the BLC2 are formed simultaneously when forming the BLC2 in a peripheral region located outside the cell region.

15. The method according to claim 14, wherein the BLC2 are formed by defining and etching bit line contact holes (BLCH) in the peripheral region, the ID3, ID2, and ID1 in the cell region, and subsequently filling in the BLCH with a conductive layer.

16. The method according to claim 1, wherein, when forming the LPC2 the BLC2 are formed through the ID3, ID2 and ID1 so that the BLC2 is placed under the BL2 and connected to the substrate.

17. The method according to claim 1, wherein the BL1 are formed simultaneously when forming gates in a peripheral region located outside the cell region.

18. The method according to claim 17, wherein the BL1 are simultaneously formed when gates are formed in the peripheral region by patterning the gate conductive layer to form the gates and the BL1.

19. The method according to claim 1, wherein the BL2 are simultaneously formed when forming peripheral region bit lines.

20. The method according to claim 19, wherein the BL2 are simultaneously formed when forming peripheral region bit lines.

21. A method for manufacturing a semiconductor device, comprising the steps of:
forming a first interlayer dielectric (ID1) on a cell region and on a peripheral region of a substrate;
forming first landing plug contacts (LPC1) through the ID1 and connected to the substrate in the cell region;
removing the ID1 from the peripheral region;
forming and patterning a conductive layer in the cell region and the peripheral region to form first bit lines (BL1) on the ID1 in the cell region that extend substantially along a first direction on the ID1 and to form gates on the substrate in the peripheral region;
forming a second interlayer dielectric (ID2) in the cell region and the peripheral region;
forming first storage node contacts (SNC1) through the ID2 in the cell region and electrically coupled to the LPC1 wherein the SNC1 are offset at a first predetermined width (W1) from the LPC1 in a direction away from the BL1;
forming a ID3 in the cell region and the peripheral region;
forming second landing plug contacts (LPC2) through the ID3 in the cell region and electrically coupled to the SNC1;
forming and patterning a conductive layer in the cell region and the peripheral region to form second bit lines (BL2) on the ID3 in the cell region that extend substantially along the first direction so that the BL2 on the ID3 are substantially in parallel to the BL1 on the ID1 and are aligned between the BL1 and the BL2 are also formed in the peripheral region;
forming a fourth interlayer dielectric (ID4) in the cell region and the peripheral region; and
forming second storage node contacts (SNC2) through ID4 in the cell region and electrically coupled to the LPC2 wherein the SNC2 are offset at a second predetermined width (W2) from the LPC2 in a direction away from the BL2.

22. The method according to claim 21, wherein the step of forming the first landing plug contacts comprises the steps of:
- defining contact holes by patterning the ID1 using a photolithographic process to expose portions of the substrate in the cell region;
- forming a conductive layer on the ID1 and within the contact holes; and
- removing portions of the conductive layer which are formed outside the contact holes.

23. The method according to claim 22, further comprising the step of forming spacers on sidewalls of the contact holes before forming the conductive layer.

24. The method according to claim 21, wherein the step of forming the first storage node contacts comprises the steps of:
- defining contact holes by patterning the ID2 using a photolithographic process to expose portions of the LPC1 such that the contact holes are offset at a first predetermined width (W1) from the LPC1 in a direction away from the BL1;
- forming a conductive layer on the ID2 and within the contact holes; and
- removing portions of the conductive layer which are formed outside the contact holes.

25. The method according to claim 24, further comprising the step of forming spacers on sidewalls of the contact holes before forming the conductive layer.

26. The method according to claim 21, wherein the step of forming the second landing plug contacts comprises the steps of:
- defining contact holes by patterning the ID3 using a photolithographic process to expose the SNC1;
- forming a conductive layer on the ID3 and within the contact holes; and
- removing portions of the conductive layer which are formed outside the contact holes.

27. The method according to claim 26, further comprising the step of forming spacers on sidewalls of the contact holes before forming the conductive layer.

28. The method according to claim 21, wherein the step of forming the second storage node contacts comprises the steps of:
- defining contact holes by patterning the ID4 using a photolithographic process to expose portions of the LPC2 so that the contact holes are offset at a second predetermined width (W2) from the LPC2 in a direction away from the BL2;
- forming a conductive layer on the ID4 and within the contact holes; and
- removing portions of the conductive layer which are formed outside the contact holes.

29. The method according to claim 28, further comprising the step of forming spacers on sidewalls of the contact holes before forming the conductive layer.

30. The method according to claim 21, further comprises the step of forming capacitors on the SNC2 after forming the SNC2.

31. The method according to claim 21, wherein, in the step of forming the LPC1, first bit line contacts (BLC1) are formed through the ID1 and placed under the BL1 and connect to the substrate.

32. The method according to claim 21, further comprises the step of forming second bit line contacts (BLC2) through the ID3, ID2, and ID1 to be placed under the BL2 and connected to the cell region and the peripheral region of the substrate.

33. The method according to claim 21, wherein forming second landing plug contacts (BLC2) through the ID3, ID2, and ID1 and under the BL2 and connected to the substrate in the cell region and the peripheral region of the substrate.

* * * * *